(12) United States Patent
Tokiwa

(10) Patent No.: US 11,756,627 B2
(45) Date of Patent: Sep. 12, 2023

(54) SEMICONDUCTOR MEMORY DEVICE

(71) Applicant: Kioxia Corporation, Tokyo (JP)

(72) Inventor: Naoya Tokiwa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/148,022

(22) Filed: Dec. 29, 2022

(65) Prior Publication Data

US 2023/0134753 A1 May 4, 2023

Related U.S. Application Data

(63) Continuation of application No. 17/387,765, filed on Jul. 28, 2021, now Pat. No. 11,594,282, which is a (Continued)

(30) Foreign Application Priority Data

Sep. 6, 2012 (JP) .................. 2012-196396

(51) Int. Cl.
    *G11C 16/16* (2006.01)
    *G11C 16/34* (2006.01)
    (Continued)

(52) U.S. Cl.
    CPC .......... *G11C 16/16* (2013.01); *G11C 16/0466* (2013.01); *G11C 16/0483* (2013.01);
    (Continued)

(58) Field of Classification Search
    CPC ................................... G11C 16/16
    (Continued)

(56) References Cited

U.S. PATENT DOCUMENTS 5,995,417 A 11/1999 Chen et al.
9,025,378 B2 5/2015 Tokiwa
(Continued)

FOREIGN PATENT DOCUMENTS

CN 102385918 A 3/2012
JP H10-055691 A 2/1998
(Continued)

OTHER PUBLICATIONS

Taiwan Office Action dated Sep. 11, 2017, filed in Taiwan counterpart Application No. 106111295, 6 pages (with translation).
(Continued)

*Primary Examiner* — Jason Lappas
(74) *Attorney, Agent, or Firm* — Kim & Stewart LLP

(57) ABSTRACT

A semiconductor memory device includes a memory block, a plurality of bit lines, a plurality of select gate lines, a plurality of word lines, and a controller. The memory block includes a plurality of memory strings, each memory string including a selection transistor and a plurality of memory cells. The plurality of bit lines are arranged in the first direction and connected to the respective memory strings. The plurality of select gate lines are arranged in the second direction and connected to gates of the respective selection transistors of the memory strings. The plurality of word lines are arranged in the third direction and connected to gates of the respective memory cells of the memory strings. The controller is configured to perform an erase operation in a unit of the memory block, and perform a sequence of erase verify operations.

12 Claims, 19 Drawing Sheets

Related U.S. Application Data continuation of application No. 17/060,953, filed on Oct. 1, 2020, now Pat. No. 11,094,380, which is a continuation of application No. 16/856,679, filed on Apr. 23, 2020, now Pat. No. 10,811,100, which is a continuation of application No. 16/719,585, filed on Dec. 18, 2019, now Pat. No. 10,672,482, which is a continuation of application No. 16/556,058, filed on Aug. 29, 2019, now Pat. No. 10,553,287, which is a continuation of application No. 16/238,390, filed on Jan. 2, 2019, now Pat. No. 10,403,370, which is a continuation of application No. 15/936,214, filed on Mar. 26, 2018, now Pat. No. 10,186,319, which is a continuation of application No. 15/790,494, filed on Oct. 23, 2017, now Pat. No. 9,928,916, which is a continuation of application No. 15/444,274, filed on Feb. 27, 2017, now Pat. No. 9,818,487, which is a continuation of application No. 15/201,108, filed on Jul. 1, 2016, now Pat. No. 9,627,080, which is a continuation of application No. 14/833,515, filed on Aug. 24, 2015, now Pat. No. 9,412,458, which is a continuation of application No. 14/686,694, filed on Apr. 14, 2015, now Pat. No. 9,147,494, which is a continuation of application No. 13/791,726, filed on Mar. 8, 2013, now Pat. No. 9,025,378.

(51) Int. Cl.
  *G11C 16/04* (2006.01)
  *G11C 16/26* (2006.01)
  *G11C 16/08* (2006.01)
  *G11C 16/10* (2006.01)
  *G11C 16/06* (2006.01)

(52) U.S. Cl.
  CPC .......... *G11C 16/26* (2013.01); *G11C 16/3445* (2013.01); *G11C 16/06* (2013.01); *G11C 16/08* (2013.01); *G11C 16/10* (2013.01)

(58) Field of Classification Search
  USPC .......................... 365/185.29, 185.22, 185.17
  See application file for complete search history.

(56) References Cited

U.S. PATENT DOCUMENTS

| | | | |
|---|---|---|---|
| 9,147,494 B2 | 9/2015 | Tokiwa | |
| 9,412,458 B2 | 8/2016 | Tokiwa | |
| 9,627,080 B2 | 4/2017 | Tokiwa | |
| 9,818,487 B2 | 11/2017 | Tokiwa | |
| 2003/0016562 A1 | 1/2003 | Im | |
| 2004/0228177 A1 | 11/2004 | Kouno | |
| 2006/0034127 A1 | 2/2006 | Kim et al. | |
| 2006/0034128 A1 | 2/2006 | Han et al. | |
| 2007/0147121 A1 | 6/2007 | Futatsuyama | |
| 2007/0195610 A1* | 8/2007 | Park | G11C 16/16 365/185.29 |
| 2007/0252201 A1 | 11/2007 | Kito et al. | |
| 2007/0297236 A1 | 12/2007 | Tokiwa | |
| 2008/0013360 A1 | 1/2008 | Hemink et al. | |
| 2008/0158994 A1 | 7/2008 | Yang | |
| 2008/0181009 A1 | 7/2008 | Arai et al. | |
| 2009/0154237 A1 | 6/2009 | Tokiwa | |
| 2010/0034026 A1 | 2/2010 | Kawamura | |
| 2010/0238732 A1 | 9/2010 | Hishida et al. | |
| 2011/0069549 A1 | 3/2011 | Tokiwa | |
| 2011/0188307 A1 | 8/2011 | Kito et al. | |
| 2011/0305089 A1 | 12/2011 | Abe et al. | |
| 2012/0008412 A1 | 1/2012 | Park | |
| 2012/0051136 A1 | 3/2012 | Kang et al. | |
| 2012/0051138 A1 | 3/2012 | Kim et al. | |
| 2012/0051143 A1 | 3/2012 | Yoon et al. | |
| 2012/0113720 A1 | 5/2012 | Kim | |
| 2012/0206975 A1 | 8/2012 | Yang | |
| 2013/0051155 A1 | 2/2013 | Shibata | |

FOREIGN PATENT DOCUMENTS

| | | |
|---|---|---|
| JP | 2011-159364 A | 8/2011 |
| JP | 2011-258289 A | 12/2011 |
| TW | 200828319 A | 7/2008 |

OTHER PUBLICATIONS

Japanese Office Action dated Jan. 27, 2015, filed in Japanese counterpart Application No. 2012-196396, 9 pages (with translation).

Chinese Office Action dated Dec. 4, 2015, filed in Chinese counterpart Application No. 20130349438.6, 12 pages (with translation).

Chinese Search Report dated Dec. 4, 2015, filed in Chinese counterpart Application No. 201310349438.6, 2 pages (with translation).

Taiwan Office Action dated May 4, 2015, filed in Taiwan counterpart Application No. 102126737, 6 pages (with translation).

\* cited by examiner

| CELL STATUS | SAOUT |
|---|---|
| HIGHER THAN ERASE VERIFY LEVEL | 1 |
| EQUAL OR LOWER THAN ERASE VERIFY LEVEL | 0 |

| LDL/UDL | DATA STATUS |
|---|---|
| 1 | VERIFY PASSED |
| 0 | VERIFY FAILED |

FIG. 9

| SAOUT | LDL | LDL STORED RESULTS |
|---|---|---|
| EQUAL TO OR LOWER THAN ERASE VERIFY LEVEL: 0 | 1 | 1 |
| HIGHER THAN ERASE VERIFY LEVEL: 1 | 1 | 0 |

FIG. 15

| SAOUT | UDL | UDL STORING RESULT |
|---|---|---|
| EQUAL TO OR LOWER THAN ERASE VERIFY LEVEL: 0 | 1 | 1 |
| HIGHER THAN ERASE VERIFY LEVEL: 1 | 1 | 0 |
| EQUAL TO OR LOWER THAN ERASE VERIFY LEVEL: 0 | 0 | 0 |
| HIGHER THAN ERASE VERIFY LEVEL: 1 | 0 | 0 |

FIG. 16

| RESULT OF COUNTING FAILED BITS | STATUS_STR |
|---|---|
| THE NUMBER OF ACCUMULATED FAIL BITS IN ALL STRINGS >, = ALLOWABLE NUMBERS | FAILED |
| THE NUMBER OF ACCUMULATED FAIL BITS IN ALL STRINGS < ALLOWABLE NUMBERS | PASSED |

| STATUS | STATUS_STR | RESULT OF DETERMINATION |
|---|---|---|
| PASSED | PASSED | BLOCK ERASE PASSED |
| FAILED | PASSED | SOME STRINGS ARE FAILED AS MORE THAN ALLOWED BUT ACCEPTABLE |
| N/A | FAILED | BLOCK ERASE FAILED |

SEMICONDUCTOR MEMORY DEVICE

CROSS-REFERENCE TO RELATED APPLICATIONS

This application is a continuation of U.S. patent application Ser. No. 17/387,765, filed on Jul. 28, 2021, which is a continuation of U.S. patent application Ser. No. 17/060,953, filed on Oct. 1, 2020, now U.S. Pat. No. 11,094,380, issued Aug. 17, 2021, which is a continuation of U.S. patent application Ser. No. 16/856,679, filed on Apr. 23, 2020, now U.S. Pat. No. 10,811,100, issued Oct. 20, 2020, which is a continuation of U.S. patent application Ser. No. 16/719,585, filed on Dec. 18, 2019, now U.S. Pat. No. 10,672,482, issued Jun. 2, 2020, which is a continuation of U.S. patent application Ser. No. 16/556,058, filed on Aug. 29, 2019, now U.S. Pat. No. 10,553,287, issued Feb. 4, 2020, which is a continuation of U.S. patent application Ser. No. 16/238,390, filed on Jan. 2, 2019, now U.S. Pat. No. 10,403,370, issued Sep. 3, 2019, which is a continuation of U.S. patent application Ser. No. 15/936,214, filed on Mar. 26, 2018, now U.S. Pat. No. 10,186,319, issued on Jan. 22, 2019, which is a continuation of U.S. patent application Ser. No. 15/790,494, filed on Oct. 23, 2017, now U.S. Pat. No. 9,928,916, issued on Mar. 27, 2018, which is a continuation of U.S. patent application Ser. No. 15/444,274, filed on Feb. 27, 2017, now U.S. Pat. No. 9,818,487, issued on Nov. 14, 2017, which is a continuation of U.S. patent application Ser. No. 15/201,108, filed on Jul. 1, 2016, now U.S. Pat. No. 9,627,080, issued on Apr. 18, 2017, which is a continuation of U.S. patent application Ser. No. 14/833,515, filed on Aug. 24, 2015, now U.S. Pat. No. 9,412,458, issued on Aug. 9, 2016, which is a continuation of U.S. patent application Ser. No. 14/686,694, filed on Apr. 14, 2015, now U.S. Pat. No. 9,147,494, issued on Sep. 29, 2015, which is a continuation of U.S. patent application Ser. No. 13/791,726, filed on Mar. 8, 2013, now U.S. Pat. No. 9,025,378, issued on May 5, 2015, which is based upon and claims the benefit of priority from Japanese Patent Application No. 2012-196396, filed Sep. 6, 2012, the entire contents of each of the applications are incorporated herein by reference.

FIELD

Embodiments described herein relate to a semiconductor memory device.

BACKGROUND

It is known that a nonvolatile semiconductor storage device erases data in block units. Depending on configuration, the required time for an erase process operation, specifically the erase verify operation for semiconductor memory devices is increasing along with the increasing capacity of the devices. It would be beneficial to semiconductor memory device performance to reduce the time required for erase process operations, including the erase verify operation.

DESCRIPTION OF THE DRAWINGS

FIG. 9 is a drawing showing the sense amplifier output and the cache data according to the first embodiment and an erase verify result.
FIG. 15 is a drawing illustrating a sense amplifier output the cache data and erase verify result according to the second embodiment.
FIG. 16 is a comparison of the number of accumulated fail bits and the threshold according to the second embodiment.

DETAILED DESCRIPTION

Figure 1:
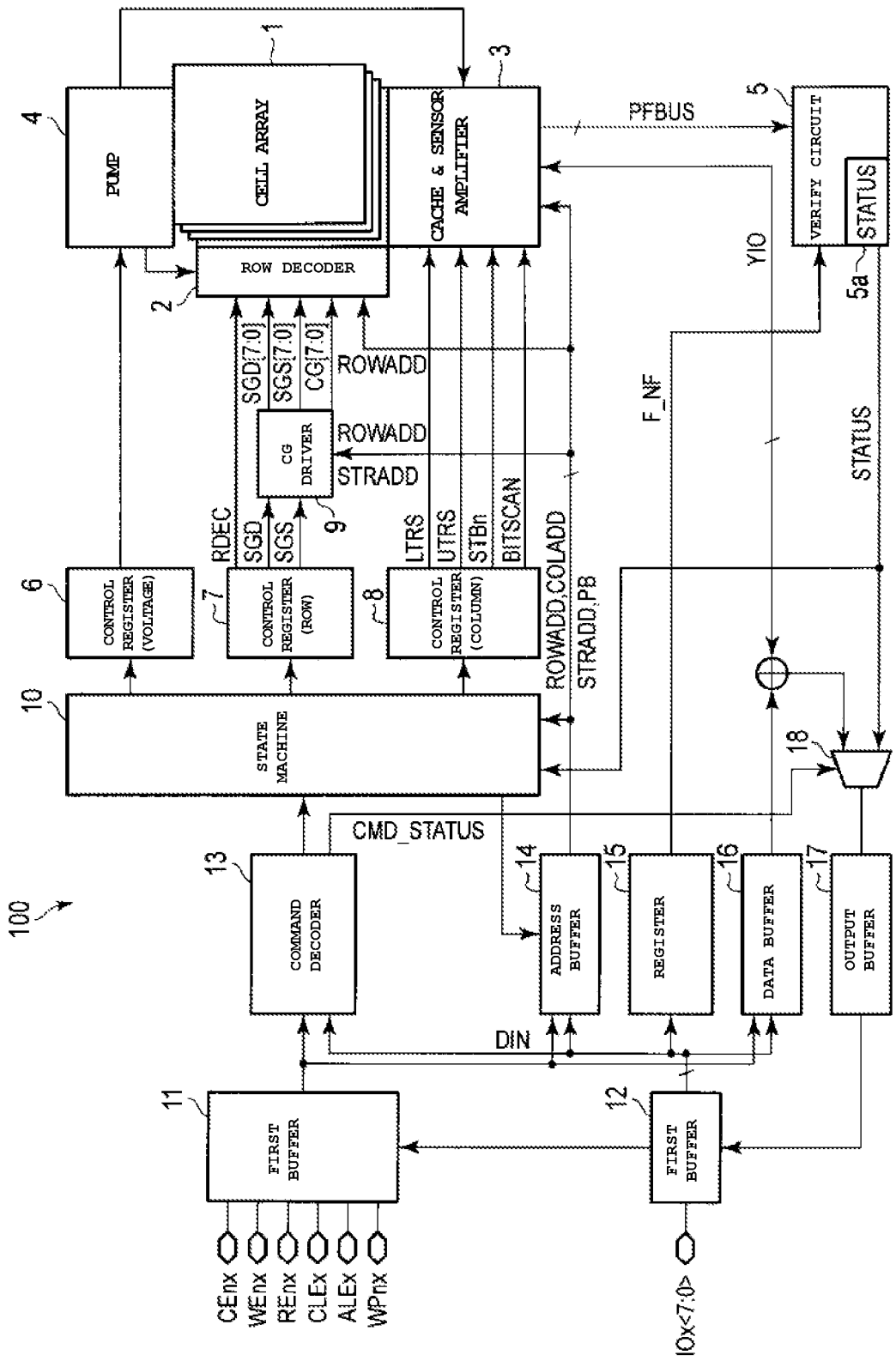
FIG. 1 is a block diagram of a semiconductor memory device according to a first embodiment.

The present disclosure describes a semiconductor memory device with a reduced erase time. In general, according to one embodiment, this embodiment will be explained with reference to the drawings. The constituent elements having the approximately same functions and configurations will be given the same notations, and duplicate explanation will be provided only when necessary. In addition, each embodiment described below exemplifies the device and method to embody the technical idea of this embodiment; the technical idea of this embodiment is not limited to the following component material, forms, configurations, dispositions or the like. The technical idea of this embodiment can be modified into various modifications within the scope of the claims.

According to an embodiment, a semiconductor memory device has a memory block including memory strings with a first selection transistor on a first end and a second selection transistor on a second end. A bit line is connected to the first selection transistor of each memory string and a sense amplifier is connected to each bit line. The memory block includes word lines connected to each memory cell transistor in the memory strings. The memory device also includes a controller to control an erase operation that includes applying an erase voltage to the word lines, addressing a first memory string by applying a selection voltage to a gate electrode of the first and second selection transistor of the first memory string, then applying an erase verify voltage to the word lines and using the sense amplifier to read data of memory cell transistors in the first memory string, then addressing a second memory string in the memory block without first discharging the word lines.

The semiconductor memory device includes multiple memory units, according to one embodiment. Each memory unit includes, connected in series between first and second terminals, a first transistor, multiple memory cell transistors, and a second transistor. Control gate electrodes of the memory cell transistors are commonly connected with the control gate electrode of corresponding memory cell transistors within each of the multiple memory units (e.g., the first memory cell in the series of multiple memory cells in a memory unit is connected to the control gate electrode of the first memory cell of the other memory units). The bit line is commonly connected to the first terminal of each the multiple memory units. The source line is commonly connected to the second terminal of the multiple memory units. The sense amplifier senses and amplifies the current or the voltage of a bit line upon receiving the enable signal. The enable signal is used for more than twice during the erase verify while the voltage is applied, for the purpose of erase verify, to the control gate electrode after the signal instructing the erase of data in multiple memory cell units has transitioned to an invalid logic.

First Embodiment

Each function block is capable of being realized using either hardware or computer software, or a combination of both. For this reason, explanation will be given below in terms of their functionality in general so that it will become clear that each block can be either of those mentioned above. Such function, whether it would function as hardware or software, depends on a specific embodiment or design constraints imposed on the overall system. A person skilled in the art can produce these described functions using various methods for each embodiment; however, both software and hardware implementations (and combinations thereof) are to be considered included within the scope of the embodiments. Also, it is not necessary to separate (segment) each of the function blocks as described in the following examples. For example, a portion of the function may be executed in a function block different from the function block described in the following explanation. Furthermore, the example function block may be divided into a smaller function sub-block. The embodiments are not intended to be limited to implementation in discrete functional blocks or in a block as specifically attributed in the example embodiments.

FIG. 1 is a block diagram of the semiconductor memory device according to the first embodiment. As shown in FIG. 1, the semiconductor memory device 100 has multiple memory cell arrays 1. The memory cell array 1 includes multiple blocks (memory blocks). Each block includes multiple memory groups, word lines, bit lines, and the like. Each memory group is a collection of strings that have multiple memory cells (memory cell transistors) connected in series. Of course, there is no restriction on the number of blocks in the memory cell array 10 and the number of the memory groups in each of blocks BLK. Each memory group is composed of a plurality of strings arranged in X direction of FIG. 2.

Pages are constructed from multiple memory cells connected to the same word line in a certain memory group of a certain block BLK. The data is typically read or written as page units and erased as block units. A definition of the pages is not limited as above description. Pages may be constructed from multiple memory cells connected to the same word line.

The memory cell array 1 has multiple strings. The string includes multiple memory cell transistors connected in series, and drain-side select gate transistors and source-side select gate transistors at either end. Each bit line is connected to multiple strings. The following explanation pertains to an example in which one bit line is connected to eight strings. A number of other connections are also possible. In such cases, related description can be substituted as appropriate.

A row decoder 2 receives a row address signal ROWADD, a signal RDEC, SGD [7:0], SGS [7:0], CG [7:0], and so on. Also, the row decoder 2 selects one block, one string, and one word line based on these received signals for example. The signal RDEC is a signal for enabling the row decoder 2. Signals SGD and SGS select one drain-side select gate transistor and one corresponding source-side select gate transistor, respectively.

The sense amplifier and the cache 3 sense and amplify the current or the voltage on the bit line, and include cache 0 and cache 1. Cache 0 and cache 1 temporarily hold data read from the memory cell array 1 or data to be written to the memory cell array 1, as well as other data. The sense amplifier and the cache 3 further include a logic circuit that will be more fully described later.

The sense amplifier and the cache 3 receive signals LTRS, UTRS, STBn and BITSCAN. Among the signal names, signal n refers to the valid logic of this signal being at a low level. For example the signal STBn is an inverted signal of the signal STB. Signals LTRS and UTRS control data input or output of cache 0 and cache 1, respectively. Signal STBn instructs the enablement of the sense amplifier. Signal BITSCAN instructs the operation of a bit scan process. The sense amplifier and cache 3 output signal PFBUS. Signal PFBUS holds information about a number of fail bits within one page.

Charge pump 4 generates a necessary voltage for various operations of the semiconductor memory device 100, and supplies this voltage to the row decoder 2 as well as the sense amplifier and cache 3. A verify circuit 5 determines whether or not writing and erase have been properly executed. Specifically, the verify circuit 5 receives signal F_NF and signal PFBUS.

The signal F_NF indicates a fail acceptable number for one page. The verify circuit 5 compares the signal PFBUS with the number of the signal F_NF. After that, the verify circuit 5 determine whether or not writing and erase have been properly executed. The comparison results are held in a status register 5a in the verify circuit 5. The status register 5a is used during erase and writing in addition to the comparison results.

The control register 6 controls the charge pump 4. The control register 7 controls row system such as row decoder 2 and the like, and outputs signals RDEC, SGD and SGS as a result. The control register 8 controls column addresses, cache, sense amplifier, cache 3 and the like, and outputs signals LTRS, UTRS, STBn, and BITSCAN for that purpose.

A CG driver 9 receives signals SGD and SGS, string address signal STRADD, and row address signal ROW-ADD, and generates signals SGD [7:0], SGS [7:0], and CG [7:0]. The notation "[7:0]" in SGD [7:0] and SGS [7:0] are used to indicate a selection of any of the specific strings in the cell array (here, string 0, string 1, . . . string 7) and The notation "[7:0]" in CG [7:0] is used to indicate a selection of any of the specific cells within a string (here, cell 0, cell 1, . . . cell 7) corresponding to a specific word line. The number of strings and cells within a string need not equal eight and need not equal one another.

The CG driver 9 generates signal SGD [7:0] in order to select the drain-side select gate transistor from signal STRADD and signal SGD. In addition, the CG driver 9 also generates signal SGS [7:0] in order to select the source-side select gate transistor from signal STRADD and signal SGS. Furthermore, the CG driver 9 generates signal CG [7:0] in order to select one word line from row address ROWADD.

A state machine (controller) 10 receives commands as well as signals ROWADD, COLADD, STRADD, and PB. The state machine (controller) 10 interprets the commands and controls control registers 6, 7, and 8 based on the interpretations and the received signals. It is responsible for controlling reading, writing, erasing and so on.

A first buffer 11 receives control signals, such as chip enable signal CEnx, write enable signal WEnx, read enable signal REnx, command latch enable signal CLEx, address latch enable signal ALEx, and write protect signal WPnx from outside of the semiconductor memory device 100. Another first buffer 12 receives signal IOx<7:0>. Signals IOx are, for example, input signals related to addresses, data, command codes, or the like.

The command decoder 13 decodes signals received from the first buffers 11 and 12 and obtains commands by decoding the received signals. The commands are supplied to the state machine (controller) 10. Also, the command decoder 13 outputs signal (command) CMD_STATUS.

The address buffer 14 decodes signals received from the buffer 11 and 12, and generates address signals ROWADD, COLADD, STRADD, and PB based on the results of the decode and the control by the state machine (controller) 10. The register 15 holds the value for defining the details of the operation of the semiconductor memory device 100. The register 15 outputs signal F_NF. Signal F_NF is supplied to the verify circuit 5.

The data buffer 16 decodes the signals received from the buffers 11 and 12, and obtains the written data YIO based on the decoded signals. The output buffer 17 temporarily holds data to be output from the semiconductor memory device 100, and supplies to the data to the buffer 12. Based on signal CMD_STATUS, the select circuit 18 supplies to the output buffer 17 the data received from the sense amplifier and cache 3 or status signal STATUS received from the status register 5a.

Figure 2:
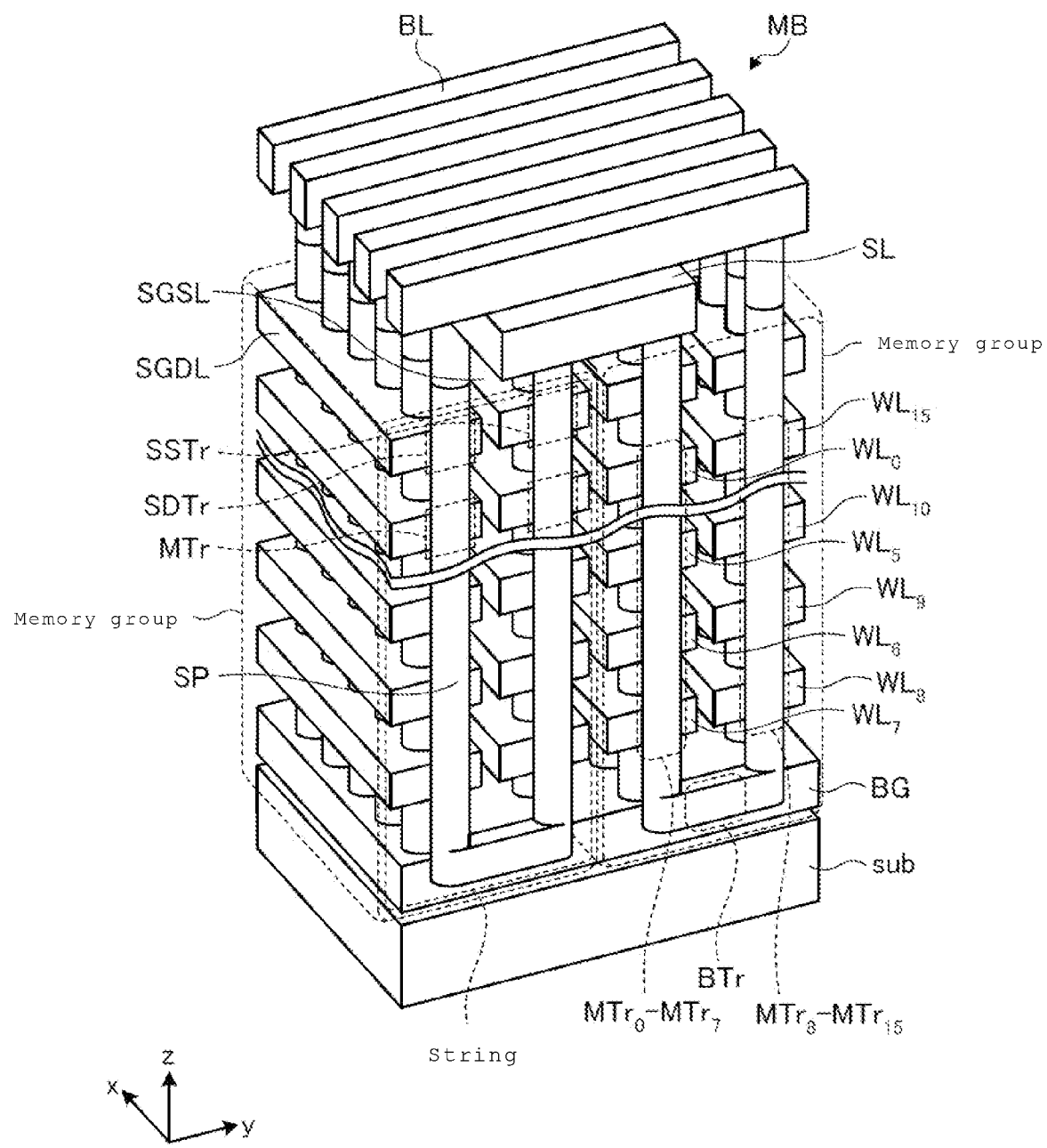
FIG. 2 is a perspective view of a portion of a memory cell array according to the first embodiment.
Figure 3:
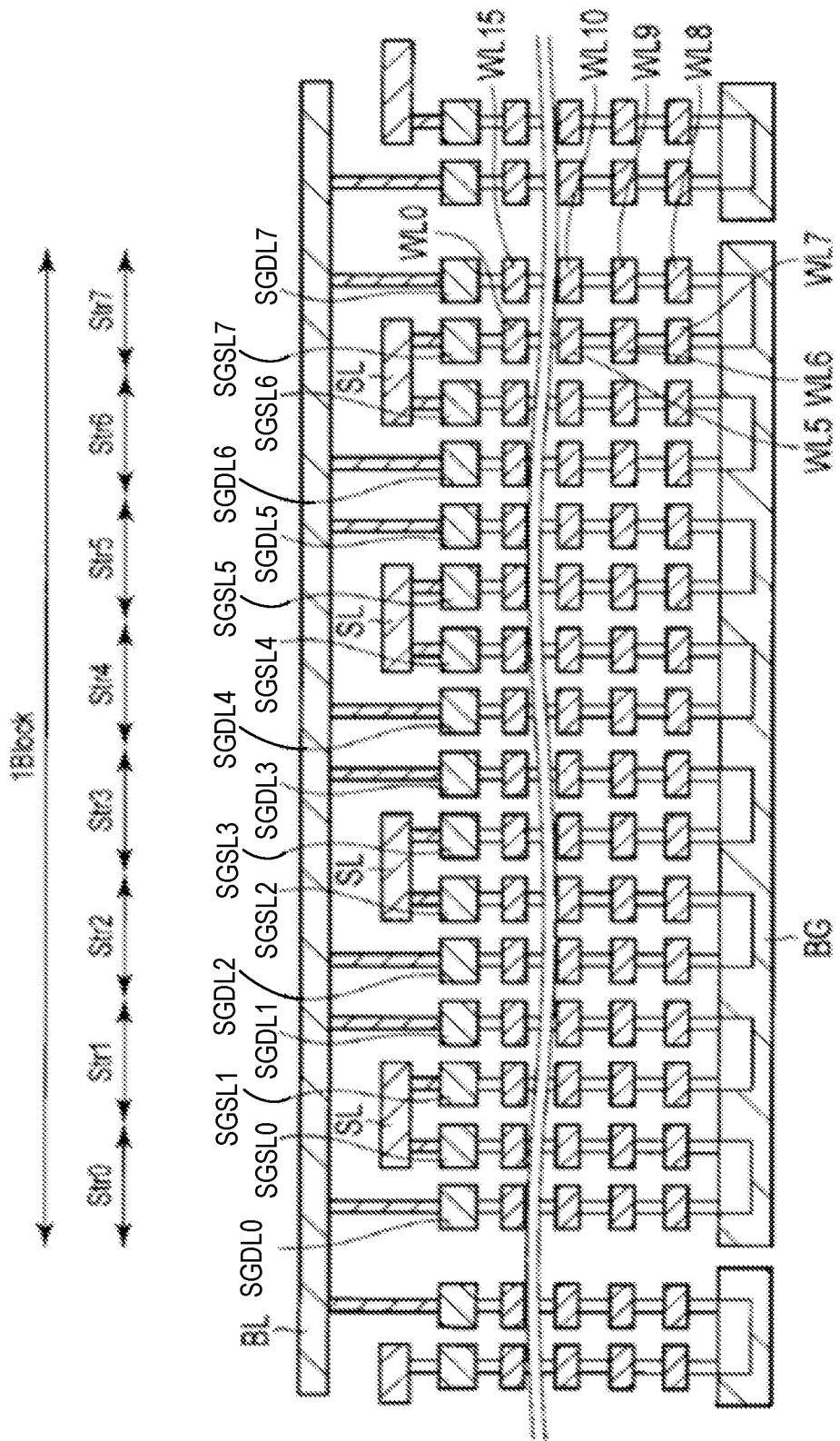
FIG. 3 is a cross-sectional view of a portion of the memory cell array according to the first embodiment.

The memory cell array 1 has a configuration shown in FIG. 2 and FIG. 3. FIG. 2 is a perspective view of a portion of the memory cell array according to the first embodiment. FIG. 3 is a cross-sectional view of a portion of the memory cell array according to the first embodiment. FIG. 2 shows two strings. FIG. 3 shows eight strings placed along the surface of YZ. As an example, one block contains eight strings.

Circuit regions CU are provided on the surface of the substrate sub, as shown in FIG. 2. The row decoder 2, sense amplifier and cache 3, as well as the charge pump 4, the state machine (controller) 10 and others can be formed on these circuit regions CU. A back gate BG made of conductive materials is formed above the circuit region CU. The back gate BG extends along the XY plane above the circuit region CU. Also, multiple strings Str are formed above the substrate sub. FIG. 2 shows an example where each string Str contains memory cell transistors MTr0-Mtr15. When there is no need to alternately distinguish the reference numbers with a digit at the end (for example, cell transistor MTr), the description that omitted the digit located at the end of the reference numbers will be used, and this description will be used to refer to the reference numbers containing all of the subscripted reference numbers. In this example, cell transistors Mtr7 and MTr8 are connected via the back gate transistor BTr. The source-side select gate transistor SSTr and the drain-side select gate transistor SDTr are connected to the cell transistors MTr0 and Mtr15 in series, respectively. The source line SL and the bit line BL are extended on top of the transistors SSTr and SDTr, respectively. The transistors SSTr and SDTr are connected to the source line SL and the bit line BL, respectively.

Figure 4:
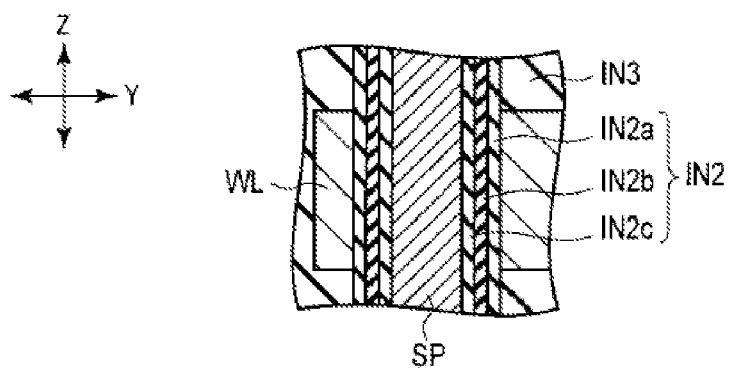
FIG. 4 is a cross-sectional view of a cell transistor according to the first embodiment.

Cell transistors MTr0-MTr15 include a semiconductor pillar SP and an insulating film IN2 on the surface of the semiconductor pillar SP (shown in FIG. 4), and also include word lines (control gates) WL0-WL15 extended along the x axis. Word lines WL0-WL15 are connected to a corresponding CG line CG (CG lines CG0-CG15), depending on the row decoder 2. The insulating film on the surface of the semiconductor pillar SP includes a block insulating film IN2a, a charge trap layer IN2b including insulating material, and a tunnel insulating film IN2c, as shown in FIG. 4. Cell transistor MTr stores data in a nonvolatile manner based on the numbers of charge carriers within the charge trap layer IN2b.

Returning to FIG. 2 and FIG. 3, the semiconductor pillar SP is made of silicon above the back gate BG. The two semiconductor pillars SP that constitute one string Str are connected by a pipe layer made from the conductive material within the back gate BG, and the pipe layer constitutes the back gate transistor BTr. Each word line WL is shared by multiple cell transistors MTr arranged along the x axis. A group of multiple cell transistors MTr connected to the same word line WL in a certain memory group constitutes a page. One page, for example, has a size of 8 Kilobytes.

The select gate transistors SSTr and SDTr include the semiconductor pillar SP, the gate insulating film (not shown in the drawing) of the surface of the semiconductor pillar SP, and further include the gate electrodes (select gate line) SGSL and SGDL, respectively. Each gate electrode SGSL is shared by multiple transistors SSTr arranged along the x axis. Each gate electrode SGDL is shared by multiple transistors SDTr arranged along the x axis. The select gate lines SGSL0-SGSL7 belong to the strings Str0-Str7, respectively. The select gate lines SGDL0-SGDL7 belong to the strings Str0-Str7, respectively. Each source line SL is connected to multiple transistors SSTr. The source lines SL within one block are mutually connected. A single bit line BL is connected to multiple select gate transistors SDTr via a plug. Two adjacent strings Str share a source line SL.

The spaces shown in FIG. 2 and FIG. 3 in which elements are not provided are embedded by the insulating film. The word line WL, the select gate lines SGSL and SGDL selected by the row decoder 2 are driven by the CG driver 9.

Although it is not shown in FIG. 2 and FIG. 3, the word lines having the same number that belong to different strings Str within 1 block (for example, word line WL0 of the string Str0 and the word line WL0 of the string Str7) are electrically connected. On the basis of this configuration, the time taken for charge and discharge of the word lines WL is longer than the time for charge and discharge the word lines WL not connected in this manner.

Figure 5:
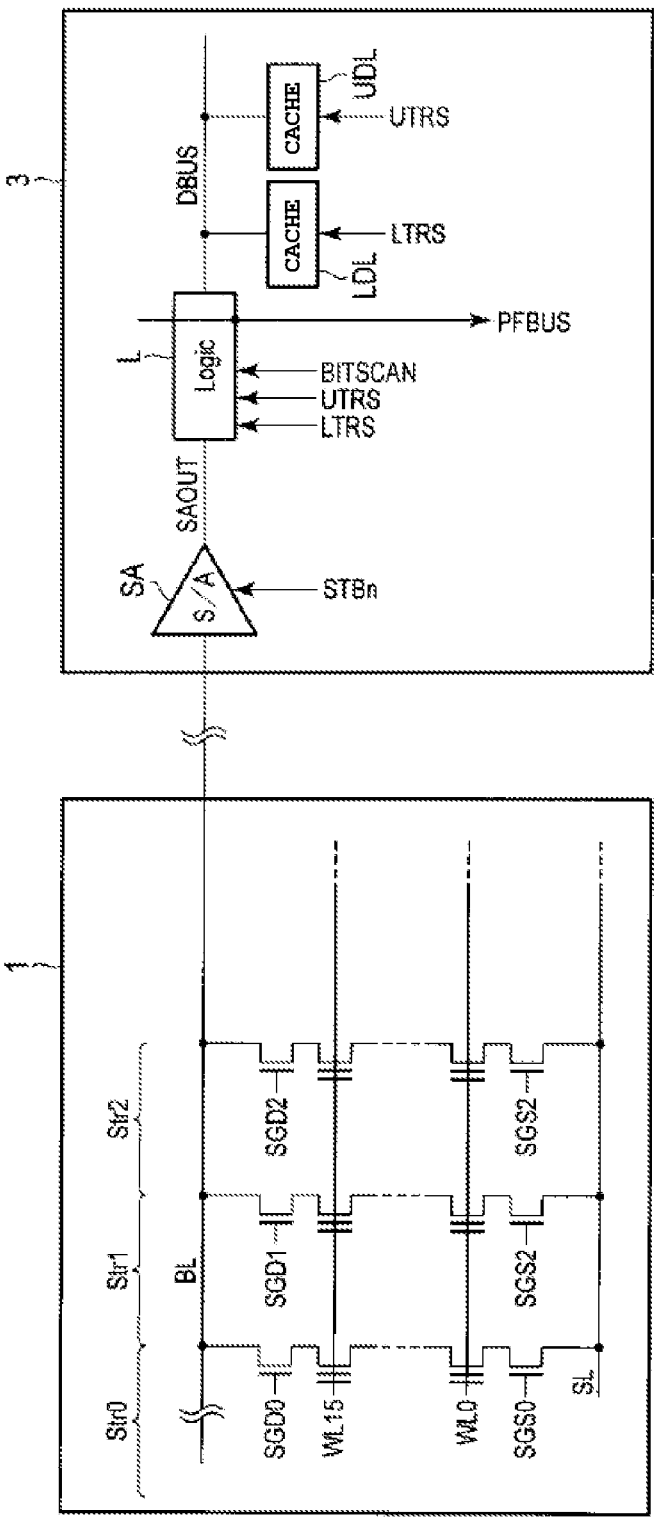
FIG. 5 is a circuit diagram of a portion of the memory cell array, a sense amplifier, and a cache according to the first embodiment.

FIG. 5 is a circuit diagram of the memory cell array 1, as well as a portion of the sense amplifier and cache 3. As shown in FIG. 5, multiple strings Str (only 3 are shown) are connected between a single bit line BL and source line SL. The word line WL0 is shared by all the strings within one Block. Word lines WL1-WL7 are also similarly shared.

The bit line BL is connected to the sense amplifier SA in in the sense amplifier and the cache 3. The sense amplifier SA receives the sense amplifier enable signal STBn as described above. The output SAOUT of the sense amplifier SA is supplied to the logic circuit L. The logic circuit L receives the signals LTRS, UTRS, and BITSCAN described above. The logic circuit L performs a variety of logical operations, which will be described later, for the signals received. The output of the logic circuit L is connected to the data bus DBUS. The logic circuit L is additionally connected to the signal line PFBUS. The data that is output to the signal line PFBUS will be described later.

The data bus DBUS is connected to the cache LDL and the cache UDL. The cache LDL and the cache UDL receive signals LTRS and UTRS, respectively. The signals LTRS and UTRS of the valid logic enable the cache LDL and UDL, respectively. The data bus DBUS transports the data to the data buffer 16 and data from the data buffer 16 of FIG. 1.

Figures 6, 7, 8:
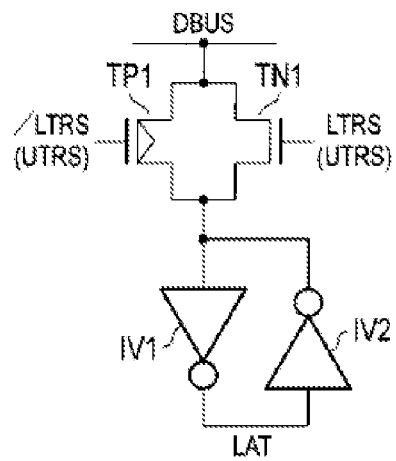
FIG. 6 is a circuit diagram showing an example of the cache according to the first embodiment.
FIG. 7 is a drawing showing the correspondence of the cell status (i.e. cell threshold voltage) and the sense amplifier output according to the first embodiment.
FIG. 8 is a drawing showing the correspondence between cache data and the verify determination result according to the first embodiment.

Cache LDL and UDL each have the configuration of, for example, FIG. 6. FIG. 6 is a circuit diagram that shows an example of the cache pertaining to the first embodiment. As shown in FIG. 6, a p-type MOSFET (Metal Oxide Semiconductor Field Effect Transistor) TP1, n-type MOSFET TN1 are connected in parallel. One end of the parallel connection structure is connected to the data bus DBUS, and the other end is connected to the input of inverter IV1 and the output of inverter IV2. The output of inverter IV1 and the input of inverter IV2 are connected, and function as a storage node LAT. The gate of the transistor TN1 receives the signal LTRS (or UTRS). The gate of the transistor TP1 receives the signal /LTRS (or /UTRS). The signal [/] means negative logic. The caches LDL and UDL have the same configuration and are interchangeable. One of them is used in the first embodiment, and the other is used in the second embodiment. In the following descriptions, for the sake of convenience, the cache LDL is used in the first embodiment, but as stated cache LDL is interchangeable with cache UDL.

The structure shown in FIG. 5 is provided for each of the bit lines.

FIG. 7 illustrates the relationship between the threshold voltage of the cells (the cell status) pertaining to the first embodiment and the output SAOUT of the corresponding sense amplifier. Generally, erase operation includes applying an erase voltage (pulse) to the cell. As a result, the threshold voltage of the cell shifts from a write level to an erase level (from a level higher than the erase level to a level below the erase level. Also, generally, erase operation includes an erase verify for the cells that are to be erased, and erase verify checks the change of threshold voltage of the cells associated with erase (being erased). The change in the threshold voltage of the cells is detected through the detection of the output SAOUT becoming 0 from 1, after the erase pulse is applied. The configuration of the sense amplifier SA may be any configuration as long as it is able to detect the status of the bit line BL during which the signal STBn, which indicates the start of the sense of the sense amplifier SA, is a valid logic (for example, low level). The potential of the output SAOUT is maintained by the sense amplifier SA, even after the end of the sense step. The erase verify, for example, is carried out per string Str. That is, for each string Str, a cell current or a voltage of the bit line BL is sensed in the state wherein the transistors SSTr and SDTr are turned ON, and all the word lines WL are driven to a predetermined potential.

FIG. 8 illustrates the corresponding relationship between the data being held in the cache LDL (or UDL) and the determination results of erase verify pertaining to the first embodiment. As described above, the cache LDL holds the data output to the data bus DBUS from the logic circuit L. During erase verify, the logic circuit L outputs the data to the bus DBUS, on the basis of the result of the logical operations based on the output SAOUT. As shown in FIG. 8, for example, the fact that the cache LDL holds 1 or 0, means that erase verify pass or verify fail, respectively, for the corresponding bit line BL. Usually, pass and fail of erase verify are determined in page units.

In erase operation, application of an erase pulse and multiple repetitions of erase verify are included. The results of erase verify are accumulated for each string. That is, the data representing the result of a certain erase verify is held in the cache LDL, and using the data being held and the sense amplifier output in the subsequent erase verify, the result of the concerned subsequent erase verify can be obtained. The data representing this obtained result is stored in the cache. These steps are repeated. FIG. 9 illustrates the sense amplifier output SAOUT during erase verify and, the data being held in the cache LDL, and the erase verify result based on these. FIG. 9 shows the final state of the cache LDL stored in accordance with the logical state of the sense amplifier output SAOUT. When the threshold voltage of memory cells in this time is equal to or lower than erase verify level, that is, when the output SAOUT is "0", data "1" (pass) is stored in the cache LDL. On the other hand, when the threshold voltage of memory cells in this time is lower than erase verify level, that is, when the output SAOUT is "1", data "0" is stored in the cache LDL. The logical operations with this output SAOUT and the cache LDL are carried out by the logic circuit L. Since erase verify will be carried out with the cache LDL being initialized to "1", the case wherein the cache LDL will start from "0" will be omitted.

The relationship between the results and data of erase verify of FIG. 7-FIG. 9 is only an example. For example, the data to be stored in the cache LDL in the initial state may also be "0". It is possible to adopt an arbitrary erase verify in the first embodiment. The first embodiment is not limited by the details of erase verify operation.

Figure 10:
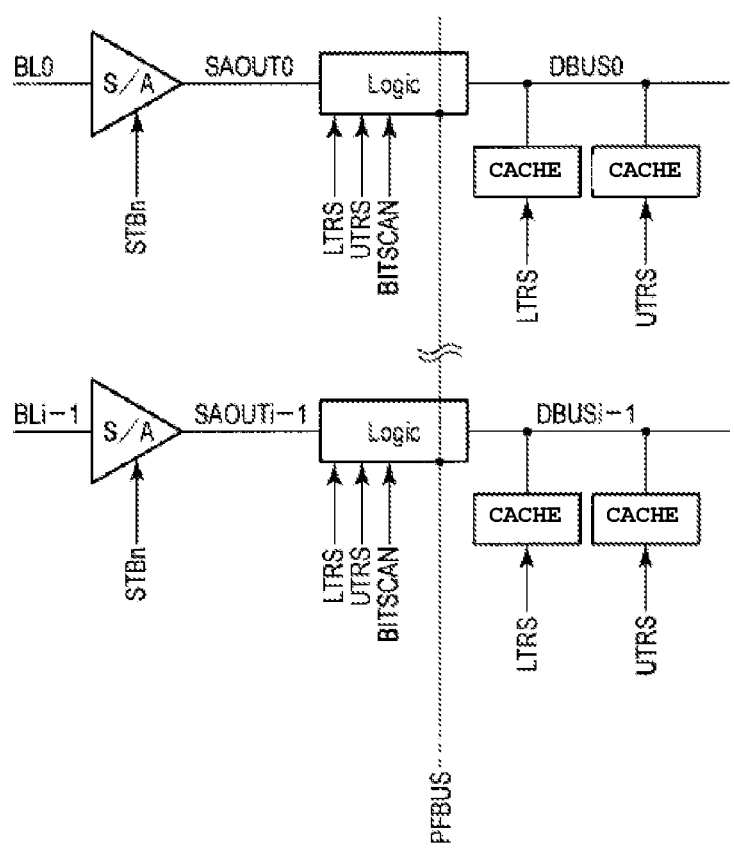
FIG. 10 is a circuit diagram of a portion of the sense amplifier and cache according to the first embodiment.

FIG. 10 is a circuit diagram that shows a portion of the sense amplifier and cache 3 pertaining to the first embodiment. FIG. 10 shows the portions within the sense amplifier and cache 3 of FIG. 5 for one page. As shown in FIG. 10, in each of the bit lines BL0-BLi−1, a portion of the sense amplifier and cache 3 shown in FIG. 5 are provided. Here, i is a natural number and corresponds to the number of the bit lines in one page. The output of the sense amplifier related to the bit lines BL0-BLi–1 is supplied to each logic circuit L, and each of their output data is output as DBUS0-DBUSi–1. The signal line PFBUS is connected in common. The logic circuits L output the fail or pass results for the bit lines BL to which each logic circuit L is connected using the signal line PFBUS, and are configured so that the number of fail bits of one page are output to the signal PFBUS. The signal PFBUS is supplied to the verify circuit 5 as described above.

Figure 11:
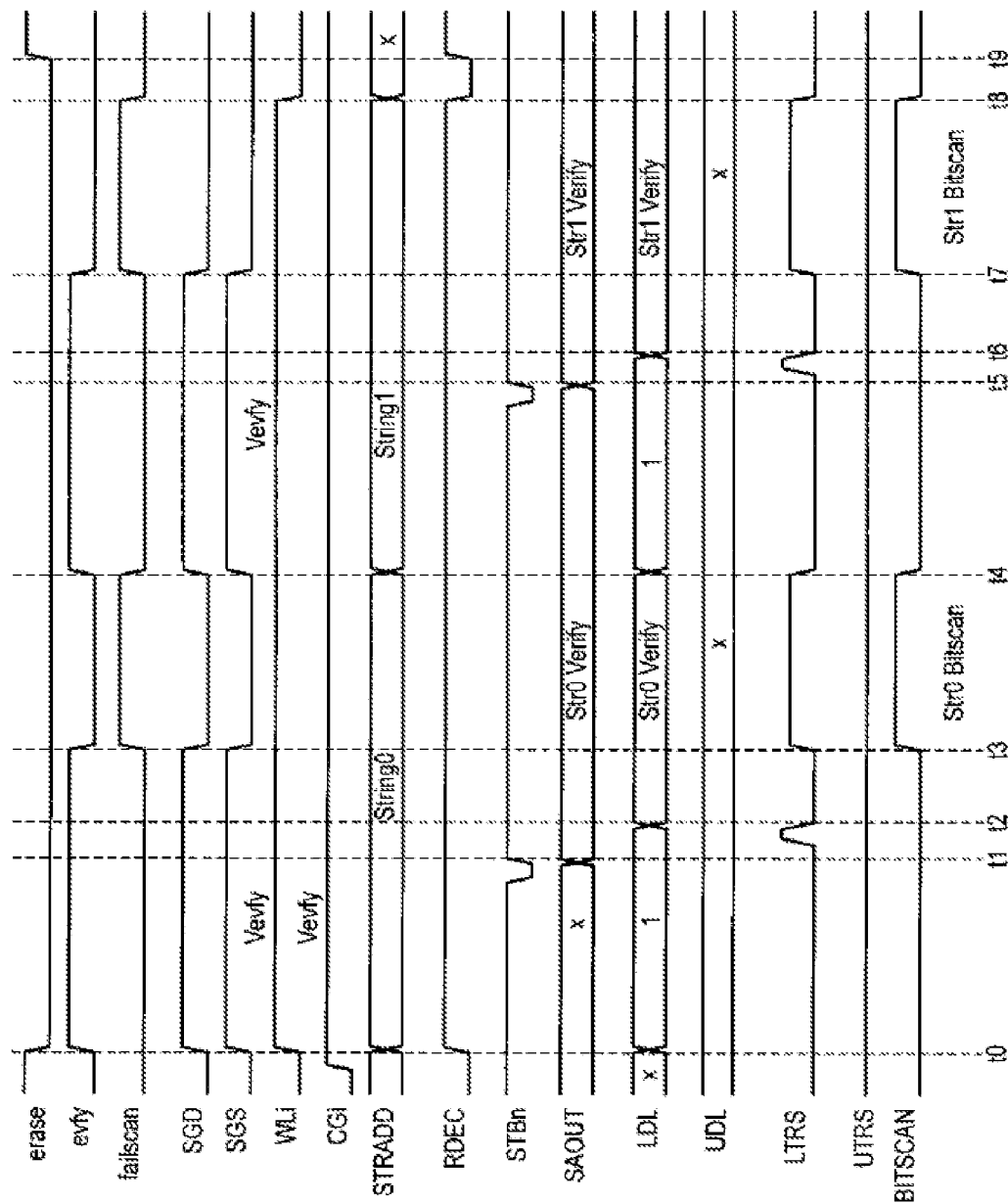
FIG. 11 is a timing chart showing potentials in a portion of the semiconductor memory device according to the first embodiment.

FIG. 11 is a timing chart of nodes in the semiconductor memory device according to the first embodiment. Specifically, FIG. 11 shows the timing chart during erase verify of the first embodiment, and represents a certain block that is to be erased. The operation of FIG. 11 is, for example, executed through a state machine (controller) 10 that controls the control registers 6, 7, and 8.

As shown in FIG. 11, at time t0, the signal erase transitions from a high level to a low level. A high level of the signal erase indicates that the semiconductor memory device 100 is in the midst of application of the erase pulse, that is, it is in a state in which the voltage necessary for erase is being applied in the block to be erased. During the signal erase is high level, the operations necessary for the voltage boost and discharge by the charge pump 4 are also included. Also, at time t0, the signal evfy will become high level (valid logic). The signal evfy of high level indicates the fact that the semiconductor memory device 100 is in the midst of an erase verify read. The erase verify is a part of erase operations, and follows the application of the erase pulse. The erase verify includes applying the erase verify voltage to all the word lines WL within the block to be erased, confirming the status of the threshold voltage of the memory cells to be erased, confirming the sense amplifier output signal SAOUT in the state where the sense amplifier and cache 3 is activated, and storing the signal SAOUT to the cache LDL. For the block to be erased, these types of operations are carried out, in sequence, for each of the string Str0-string Str7. The erase verify will be described in detail below.

The times t0-t4 are the periods for erase verify of the string Str0. Therefore, during time t0-t4, the string address signal STRADD is set to a value that selects the string Str0. Also, before time t0, all of the CG lines CG are charged to the erase verify voltage Vevfy. Along with the erase verify start of time t0, the row decoder enable signal RDEC becomes a high level (valid logic). As a result, the potential of the CG line CG is transferred to the corresponding word line WL, and from time t0 the word line WL is charged to the erase verify voltage Vevfy. Also, at time t0, the SG lines SGD and SGS shift to a high level. Since the signal STRADD has selected the string Str0, the potential of the high level SG lines SGD and SGS is transferred to the select gate lines SGDL0 and SGSL0 of the string Str0. Also, the cache LDL is initialized at time t0. As a result, all the caches LDL hold the data "1".

After time t0, a predetermined setup time is required to stabilize word line voltage or another internal node voltage. After that, the signal STBn becomes a low level (valid logic). The signal STBn of valid logic enables each sense amplifier SA. After the start of operation of each sense amplifier SA, the signal STBn keeps low level, then the signal STBn returns to a high level at time t1. As a result, at time t1, each sense amplifier output SAOUT is fixed. Furthermore, cache UDL is not used in the first embodiment, but it is instead used in the second embodiment described later.

Next, the signal LTRS will become a high level (valid logic), and the data within each cache LDL can be read out. Each of this read out data, along with the corresponding sense amplifier output SAOUT, is logically operated by the corresponding logic circuit L. That is, for each of the bit lines BL0-BLi–1, logical operations are performed for the output SAOUT and data of the cache LDL. The logical operations are as described above, with FIG. 9 as a reference. The operation results according to each logic circuit L are stored in the corresponding cache LDL. The data stored in LDL is fixed when the signal LTRS becomes a low level (disable) at time t2.

Next, a check for the data in the cache LDL is performed. That is, the number of fail bits will be counted. This check includes the determination of whether the result of erase verify read (that is, the data within the cache LDL) has padded or not. In other words, this check includes that the fail bits in the cache LDL is less than the predetermined value or not. The predetermined value means, for example, the number of fail bits allowed per one page or per one block. For the check, at time t3, the signal failscan becomes a high level (valid logic). The signal failscan is an internal signal of the state machine (controller) 10, and is the same signal as the signal BITSCAN, and the signal failscan of valid logic indicates a bit scan operation. Also, at time t3, the SG lines SGD and SGS and the signal evfy become a low level (invalid logic).

On the other hand, the signal RDEC is maintained at a high level even after time t3. As a result, the word line WL is connected to the signal CG line. In other words, the potential of the signal CG line CG (the erase verify voltage Vevfy) continues to be transferred. Thus, the discharge and recharge of the word line WL will be unnecessary for the erase verify of the subsequent string Str1. As described above, the fact that the word line WL is shared amongst different strings Str is being utilized.

Also, at time t3, the signal LTRS becomes a high level, and as a result, the data of each cache LDL is received by the corresponding logic circuit L. Furthermore, at time t3, the signal BITSCAN becomes a high level (valid logic). As a result, each logic circuit L outputs the data that indicates the number of fail bits to the signal line PFBUS. In this case, the number of fail bits indicates the one for the string that is to be checked, Str0.

The number of fail bits is notified to the verify circuit 5. The verify circuit 5 compares the number of fail bits with a threshold value indicated by the signal F_NF received from the register. When the number of fail bits is lower than the threshold value, the verify circuit 5 sets the status of the fact that it has passed to the status register 5a. On the other hand, when the number of fail bits is greater than or equal to the threshold value, the verify circuit 5 sets the status indicating that a string has failed to the status register 5a. In this way, the erase verify of the string Str0 is complete. In accordance with this, at time t4, the signals failscan, BITSCAN, and LTRS will become low level. FIG. 11 shows an example where the erase verify in the string Str0 has passed.

The state machine (controller) 10 receives the status signal for the string Str0, and recognizes that the erase verify in the string Str0 has passed, and then, executes the erase verify of the string Str1. The erase verify of the string Str1 is the same as the erase verify of the string Str0, except for the string address. That is, during time t4 to time t8, the string address signal STRADD is set to a value that selects the string Str1. At time t4, the signal evfy becomes a high level, and erase verify starts. Also, at time t4, SGD and SGS set to a high level. As a result, the select gate lines SGDL1 and SGSL1 of the string Str1 become a high level. Furthermore, at time t4, the cache LDL gets initialized.

As described above, continuing from the erase verify of the string Str0, the signal RDEC maintains a high level. In other words, the word line WL is connected to the CG line CG, the erase verify voltage Vevfy is transferred to the word line WL. For this reason, the time to charge the word line WL is unnecessary for the erase verify of Str1.

Next, at time t5 to time t8, the same operations as the operations at time t1 to t4 are carried out, respectively. As a result, the number of fail bits for string Str1 is output on the signal PFBUS. FIG. 11 shows an example where the string Str1 has failed in erase verify. The state machine (controller) 10 recognizes that erase verify in the string Str1 has failed, and prepares to reapply the erase pulse to the block to be erased. On that account, at time t8, the row decoder signal RDEC becomes a low level, and the string address signal STRADD will become a value that does not select any string Str. As a result, the word line WL is disconnected to the CG line CG, and the word line WL begins to discharge from the erase verify voltage Vevfy.

Next, the erase pulse is applied from time t9. On that account, the signal erase becomes a high level. After the application of the erase pulse, similar to the steps from time t0, erase verify is carried out once again.

In this manner, until the string erase verify is failed, the signal RDEC maintains a high level, and consequently the word line WL maintains the erase verify voltage Vevfy, and the sense amplifier enable signal STBn for the erase verify of the strings becomes a valid logic sequentially.

Figure 12:
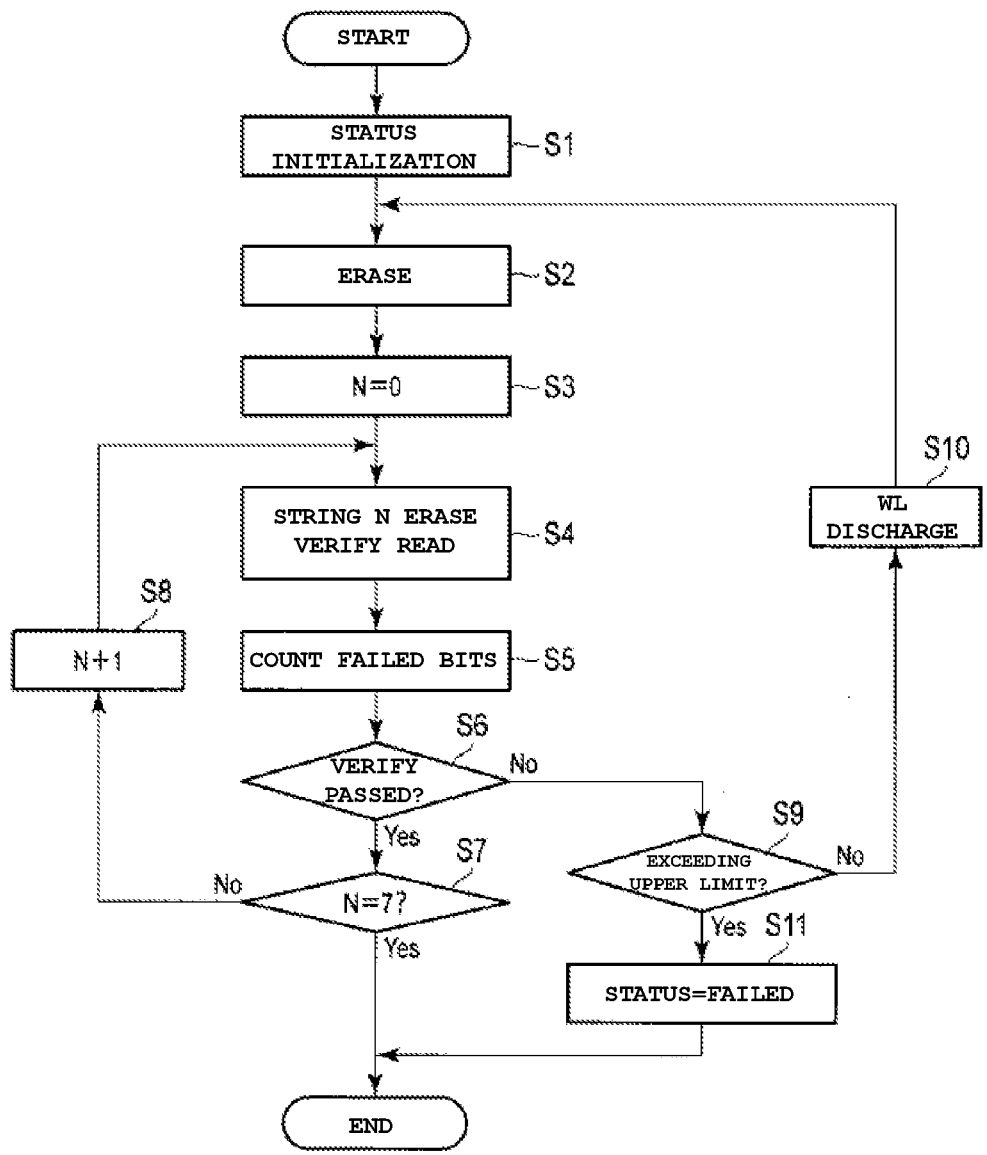
FIG. 12 is a flow chart of an erase operation in the semiconductor memory device according to the first embodiment.

FIG. 12 is a flow chart of the erase of the semiconductor memory device pertaining to the first embodiment. Similar to FIG. 11, the flow of FIG. 12 is executed, for example, through a state machine (controller) 10 that controls the control registers 6, 7, and 8.

As shown in FIG. 12, the state machine (controller) 10 initializes the status register 5a in the verify circuit 5 (step S1). In step S2, the state machine (controller) 10 applies an erase pulse to the block to be erased. Step S2 corresponds to the period during which the signal erase of FIG. 11 is at a high level. In step S3, the signal for specifying the string address is initialized. In fact, the string address signal STRADD is set to 0. In FIG. 12, the parameter N that specifies the string address is set to 0. N is a natural number from 0 to 7 (number of maximum string), for example.

In step S4, the state machine (controller) 10 carries out the erase verify read for the string StrN. Step S4 corresponds to the period during which the signal evfy of FIG. 11 is at a high level, and as described above, includes read out of data from the cells, sense, logical operations with each of the sense amplifier outputs SAOUT and the data within the corresponding caches LDL, and storage of the logical operations results to each of the caches LDL. Next, in step S5, the state machine (controller) 10 counts the number of fail bits for the string StrN. Next, in step S6, the state machine (controller) 10 compares the number of fail bits with the threshold value. Steps S5 and S6 correspond to the period during which the signal BITSCAN of FIG. 11 is at a high level, and as described above, include the output of the number of fail bits to the signal PFBUS, comparison of the number of fail bits with the threshold value, and the storage of the comparison result to the status 5a.

If the decision at step S6 is a Yes, erase verify is carried out for the next string Str. Specifically, first, in step S7, the state machine (controller) 10 determines whether erase verify has been completed for all the strings Str. More specifically, the state machine (controller) 10 determines whether the string Str, for which erase verify is carried out in step S4, is the last string. In this example, the state machine (controller) 10 confirms whether N is 7 or not. If the decision of step S7 is a Yes, this means that erase verify has been completed for all the strings Str, and the flow ends. If the decision of step S7 is a No, the flow goes to step S8. In step S8, the state machine (controller) 10 increments N by 1. That is, the state machine (controller) 10 increments the signal STRADD by 1. After step S8, the flow returns to step S4.

When the decision at step S6 is a No, the flow goes to step S9. In step S9, the state machine (controller) 10 checks as to whether the repetition number of the erase and the erase verify has exceeded the threshold value (upper limit). As described above, if a certain string Str fails erase verify, erase (erase pulse application) will be carried out again. However, an upper limit of the repetition number of erase and erase verify is usually set. When the repetition number of erase and erase verify becomes to the upper limit during erase operation, it is treated as a block erase fail. Therefore, the state machine (controller) 10 stores the erase count for the block to be erased in registers, etc., and compares the stored value with the threshold value in step S9. When the decision at step S9 is a No, the flow goes to step S10. In step S10, the state machine (controller) 10 prepares to reapply the erase pulse to the block to be erased. This preparation includes, for example the discharge of the word line WL as described above, and corresponds to the operations from time t8 of FIG. 11. After step S10, the flow returns to step 2.

When the decision at step S9 is a Yes, the flow goes to step S11. In step S11, the state machine (controller) 10 sets fail in the status register 5a to indicate that the block to be erased has failed. Subsequently, erase of selected specific block ends.

As described above, according to the semiconductor memory device pertaining to the first embodiment, after the erase verify read for a certain string Str, the word line WL maintains the erase verify voltage Vevfy. For this reason, the discharge of the word line WL for the erase verify of the subsequent string Str and the recharge towards erase verify are unnecessary. The discharge of the word line WL will be executed, when erase verify fails and erase is carried out again. As a result, especially, when each string erase characteristics is similar and when the erase verify for each string has passed, the time for erase operation (erase and erase verify) is shorter than the conventional way.

Second Embodiment

In the first embodiment, the number of fail bits is counted per string. On the other hand, in the second embodiment, the number of fail bits accumulated across all the strings will be counted.

Figure 13:
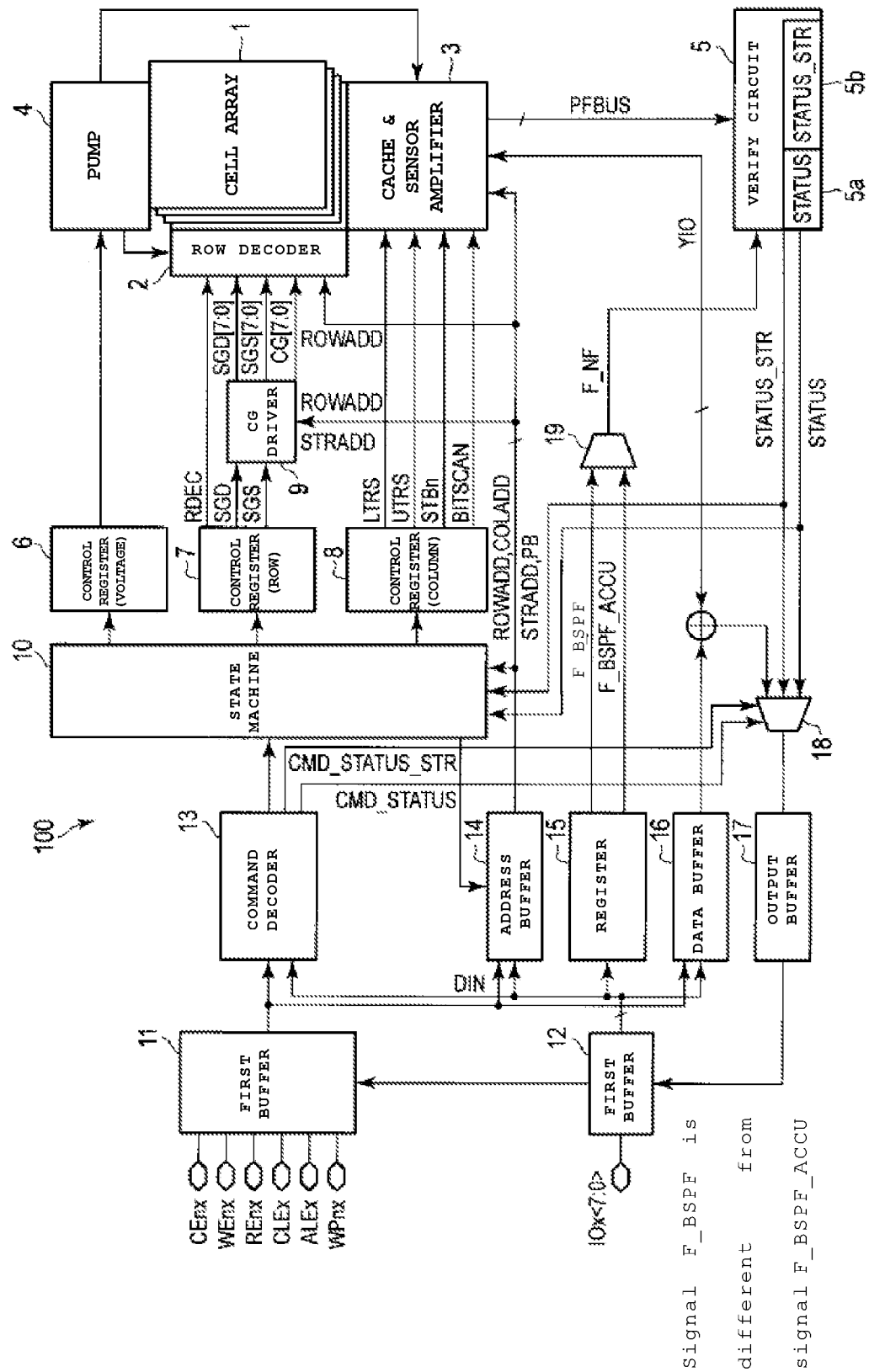
FIG. 13 is a block diagram of the semiconductor memory device according to a second embodiment.

FIG. 13 is a block diagram of the semiconductor memory device pertaining to the second embodiment. FIG. 13 is similar to the first embodiment (FIG. 1), but several components have been added to FIG. 1. As shown in FIG. 13, the register 15 additionally maintains two threshold values F_BSPF, F_BSPF_ACCU, and this output signals F_BSPF and F_BSPF_ACCU. The signals F_BSPF and F_BSPF_ACCU are received by the select circuit 19. The select circuit 19 outputs one of the signals F_BSPF and F_BSPF_ACCU as the signal F_NF, according to the control of the state machine (controller) 10. The signal F_NF is received by the verify circuit 5, the same as in the first embodiment. The threshold value F_BSPF is same as F_NF represented in the first embodiment. That is, it is a threshold value used in counting the number of fail bits. On the other hand, the threshold value F_BSPF_ACCU is a threshold value used in counting the number of fail bits accumulated across all the strings. The threshold value F_BSPF and the threshold value F_BSPF_ACCU are typically different.

The verify circuit 5 has an additional status register 5b. The status register 5b stores the results of accumulated string erase verify. The result within the status register 5b is supplied to the state machine (controller) 10 as the signal STATUS_STR. The signal STATUS_STR is also supplied to the select circuit 18. Upon receiving the signal CMD_STATUS_STR from the command decoder 13, the select circuit 18 supplies the signal STATUS_STR to the output buffer 17. The output buffer 17 outputs the received signal STATUS_STR from the semiconductor memory device 100. FIG. 13 depicts an example where one of the signal STATUS and the signal STATUS_STR is output. However, a separate IO port may be provided in addition to the input output port IO connected to the first buffer 12, and the signals STATUS and STATUS_STR may be output simultaneously from each of those IO ports. The components other than the components described for the second embodiment are the same as in the first embodiment, including FIGS. 2-6, and FIG. 10.

Figure 14:
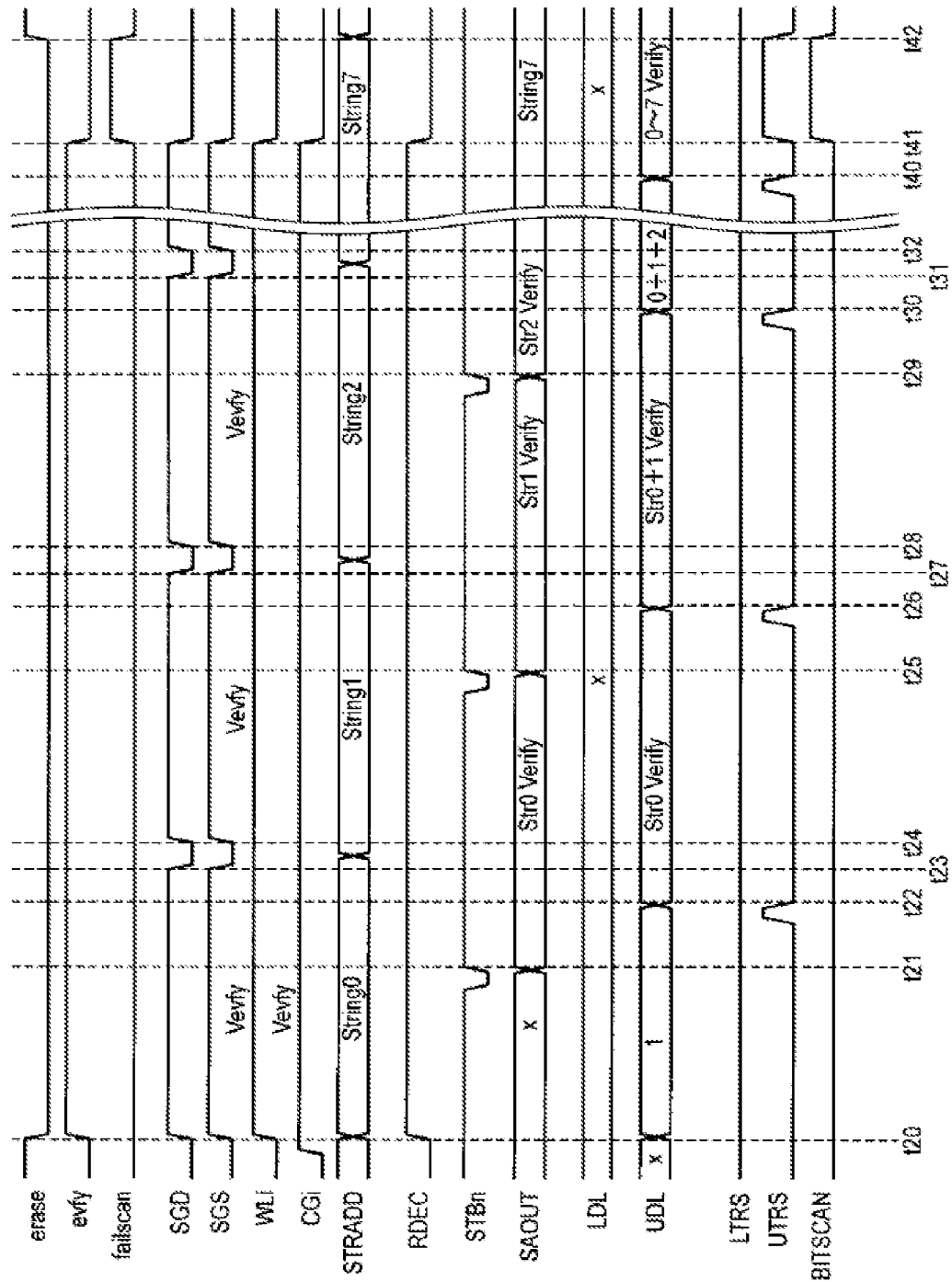
FIG. 14 is a timing chart showing potentials in a portion of the semiconductor memory device according to the second embodiment.

FIG. 14 is a timing chart of nodes in the semiconductor memory device according to the second embodiment. Specifically, FIG. 14 shows the timing chart during the erase verify in the second embodiment, and represents a certain block that is to be erased. The operations of FIG. 14 are executed, for example, through a state machine (controller) 10 that controls the control registers 6, 7, and 8.

First, the cache UDL is initialized before erase or at least before erase verify. Also, the operations until the completion of erase, i.e. the change of the signal erase to a low level at time t20 are the same as that in the first embodiment. From time t20, verify read will be carried out for the first string Str0. The operations from time t20 to t22 are essentially the same as the operations until time t0 to t3 of the first embodiment (FIG. 1). The differences are the fact that the logic operations shown in FIG. 15 are performed, the fact that the data in cache UDL is used in the logical operations, and the fact that the results of the logical operations are stored in the cache UDL. Based on the fact that the cache UDL is being used, the signal UTRS will become high level (valid logic) just before time t22. FIG. 15 illustrates the output of the sense amplifier output, the cache UDL and the results of the erase verify in second embodiment. In the erase verify read for string Str0, the cache UDL is in an initialized state and holds the data "1". As a result of the erase verify read for the string Str (in the current example, string Str0), if the output SAOUT is "0", the result of the logical operations is "1" (pass) as shown in the first row of FIG. 15. This result is stored in the corresponding cache UDL. On the other hand, if the output SAOUT is "1", the result of the logical operations is "0" (fail) as shown in the second row. This result is stored in the corresponding cache UDL. Return to FIG. 14. At time t22, the signal UTRS is set to a low level (invalid logic), then the data of cache UDL will be fixed.

Next, erase verify read for string Str1 will be carried out, and will be accumulated with the result for string Str0. The count of the number of fail bits for string Str0 is not carried out. This point is in contrast to the first embodiment. For the erase verify read for string Str1, first, the signal evfy continues to maintain a high level even at time t23. Even after time t23, the signal RDEC maintains a high level, and for this reason, the word line WL maintains the erase verify voltage Vevfy. This point is the same as that in the first embodiment. On the other hand, at time t23, the SG lines SGD and SGS become a low level (invalid logic) once. This is for transitioning from a state where string Str0 is selected, to a state where string Str1 is selected. Next, the signal STRADD is set to a state in which the string Str1 is selected. This state continues until before time t28.

At time t24, the state machine (controller) 10 makes the SG lines SGD and SGS a high level. Next, the state machine (controller) 10 carries out erase verify read for the string Str1. The erase verify read for string Str1, and all the subsequent strings Str, is essentially the same as that for string Str0, with only different target address.

First, just before time t25, the sense amplifier SA is enabled, and at time t25, the sense result of the sense amplifier SA is fixed, and each sense amplifier SA outputs its result on the signal SAOUT. Next, due to the fact that the signal UTRS becomes a high level, the data of each cache UDL is read out, and along with the corresponding output SAOUT, it become the targets of the logical operations by the logic circuit L. The logical operations are as shown below. As described above, the result (output SAOUT) of erase verify read for a certain string Str is accumulated to the results of the strings Str in the previous result. Specifically, it is as shown in FIG. 15. The first row of FIG. 15 corresponds to the case when the results for the strings Str checked until now have all passed, and the results for the current string have also a passed. As a result, the value that is stored is "1" (pass). The second row corresponds to the case when the results for all the strings Str checked until now have all passed, and the results for the current string have failed. As a result, the value that is stored is "0" (fail). The third row and fourth row correspond to the case when the result for at least one of the strings Str checked till now is a fail. For the cases of the third row and fourth row, regardless of the result for the current string, the value that is stored will be "0" (fail).

Next, at time t26, the signal UTRS is set to low level and then the data of cache UDL is fixed. After this, similar to the strings Str0 and Str1, erase verify read is carried out for strings Str2-Str7, and as a result, at time t40, the accumulated result is stored in the cache UDL.

From time t41, the state machine (controller) 10 carries out a count of the number of fail bits for the accumulated results of all the strings Str0-Str7. This count of the number of fail bits is essentially the same as the count of the number of fail bits for each string of the first embodiment. That is, at time t41, the signal evfy, SG lines SGD and SGS, word line WL, CG line CG, and signal RDEC become a low level. Also, at time t41, the signals failscan, BITSCAN, and UTRS become a high level (valid logic). As a result, similar to the first embodiment, the number of fail bits is output as the signal PFBUS.

The verify circuit 5 compares the accumulated number of fail bits (signal PFBUS) with the threshold value F_BSPF_ACCU within the signal F_NF. As described above, this threshold value differs from the threshold value F_BSPF for one string of the first embodiment. If the count of the string accumulated fail bits is below the threshold value (allowable count), the verify circuit 5 sets a status that indicates pass in the status register 5b, as shown in FIG. 16. On the other hand, if the count of the string accumulated fail bits is equal to or above the threshold value, it sets a status that indicates fail in the status register 5b.

Figure 17:
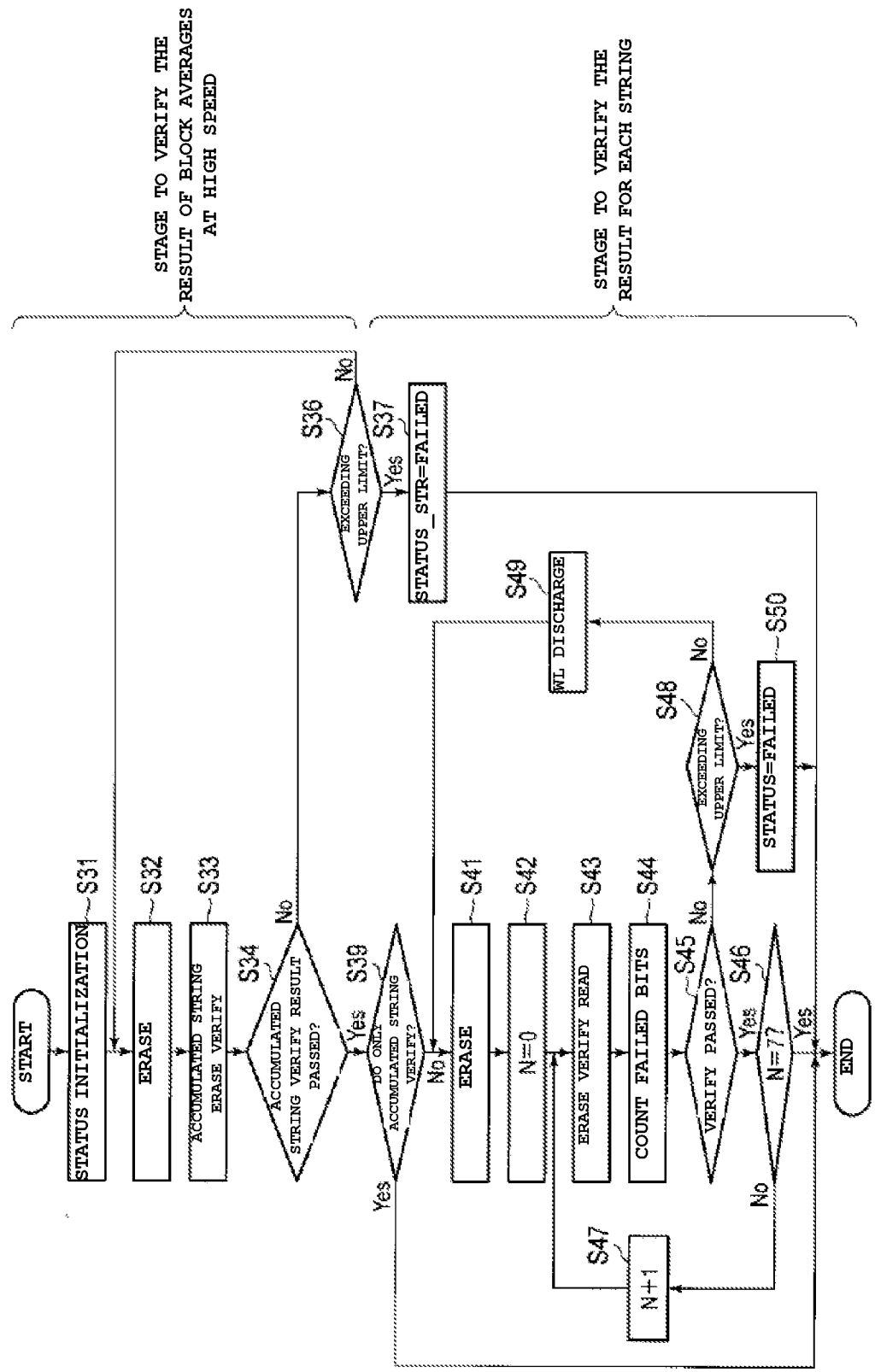
FIG. 17 is a flow chart of an erase operation of the semiconductor memory device according to the second embodiment.

FIG. 17 is a flow chart of the erase operation of the semiconductor memory device pertaining to the second embodiment. Similar to FIG. 14, the flow in FIG. 17 is executed, for example, by a state machine (controller) 10, which controls the control registers 6, 7 and 8.

The flow shown in FIG. 17 is roughly divided into two stages. In the first stage, as described by referring to FIG. 14, the result of the accumulated string erase verify is checked, and the verify results of the block average are determined. This type of check is completed at a high speed. In the first stage, the steps S31-S34 described later are included. In the second stage, the check and re-erase is carried out per string. This type of check leads to detailed results. In the second stage, the steps S41-S49 described later are included.

As shown in FIG. 17, in step S31, the state machine (controller) 10 initializes the status registers 5*a* and 5*b* within the verify circuit 5. In step S32, the state machine (controller) 10 applies an erase pulse to the block to be erased. Step S32 corresponds to the interval in which the signal erase of FIG. 14 is at a high level. In step S33, the state machine (controller) 10 carries out the accumulated string erase verify for all the strings. Step S33 corresponds to the interval in which the signal evfy of FIG. 14 is at a high level. As described above, Step S33 includes read out from the cells, sense, logical operations used by each sense amplifier output SAOUT and each cache UDL and storing logic operation result in each cache UDL for the strings Str0-Str7. As a result of step S33, the result of accumulated string erase verify Str0-Str7 is stored in the caches UDL.

In step S34, the state machine (controller) 10 checks the result of accumulated string erase verify stored in the caches UDL. That is, first, the data that indicates fail or pass from all the caches UDL is output as the signal PFBUS. The signal PFBUS holds the number of UDLs that has failed (accumulated string fail bits count). The verify circuit 5 compares the number of accumulated string fail bits with the threshold value F_BSPF_ACCU. Step S34 corresponds to the interval in which the signals failscan or BITSCAN of FIG. 14 are at a high level. If the number of the accumulated string fail bits is less than the threshold value, the accumulated string erase verify is a pass and the register 5*b* in the verify circuit 5 is set to pass status. On the other hand, if the accumulated string fail bits is equal to or more than the threshold value, the accumulated string erase verify is a fail and the register 5*b* in the verify circuit 5 is set to fail status.

When the decision at step S34 is a No, the flow goes to step S36. Step S36 is the same as Step S9 of FIG. 12. In step S36, the state machine (controller) 10 checks as to whether the number of repetitions of the erase and erase verify has exceeded the threshold value (upper limit). If the decision of step S36 is a No, the flow returns to step S32. If the decision of step S36 is a Yes, the flow goes to step S37. Step S37 is identical to step S11 of FIG. 12. In step S37, the state machine (controller) 10 sets the data that indicates fail in the status register 5*b*. Subsequently, the erase ends. The fail status of the status register 5*b* means that the accumulated string erase verify has failed.

On the other hand, when the decision at step S34 is a Yes, the flow goes to step S39. In step S39, the state machine (controller) 10 checks whether the erase sequence specifies only high speed erase verify, that is, only the accumulated string erase verify. This check is carried out through, for example, a check of a mode that has been set in advance in the state machine (controller) 10. When it is the mode in which the erase sequence includes a high speed check only, the flow ends. On the other hand, when it is the mode in which the erase sequence includes a detailed check, the flow goes to the second stage. The second stage starts from step S41. The second stage is essentially the same as the first embodiment, and erase verify is carried out for each string. That is, steps S41-S50 are the same as the steps S2-S11 of FIG. 12, respectively.

In step S41, the state machine (controller) 10 applies an erase pulse to the block to be erased. In step S42, the state machine (controller) initializes the parameter N to 0. In step S43, the state machine (controller) 10 carries out erase verify read for the string StrN that is specified. Step S43, as described above, includes read out of data from the cells, sense, logical operations with each of the sense amplifier outputs SAOUT and the data within the corresponding caches LDL, and storage of the logical operations results to each of the caches LDL.

In step S44, the state machine (controller) 10 counts the number of fail bits for the string StrN. In step S45, the state machine (controller) 10 compares the number of fail bits with the threshold value F_BSPF. Steps S44 and S45 include output of the number of fail bits to the signal PFBUS, comparison of the number of fail bits with the threshold value, storage of the comparison result to the status 5*a*.

If the result of step S45 is a Yes, in step S46, the state machine (controller) 10 determines whether the string Str for which erase verify is carried out in S43 is the last string or not. If the decision at step S46 is a Yes, the flow ends, and if it is a No, then in step S47, the state machine (controller) 10 increments N by 1. After step S47, the flow returns to step S43.

When the decision at step S45 is a No, in step S48, the state machine (controller) 10 checks as to whether the number of repetitions of the erase and erase verify has exceeded the threshold value (upper limit). When the number of repetitions has not exceeded the upper limit, in step S49, the state machine (controller) 10 prepares to reapply the erase pulse towards the block to be erased, and subsequently the flow returns to step S41. When the decision at step S48 is a Yes, in step S50, the state machine (controller) 10 sets the data that indicates fail in the status register 5*a*.

As described above, according to the second embodiment, the result of the erase verify for each string is accumulated across multiple strings, and fail or pass is determined for this accumulated result. In the case of the check and re-erase per string as in the prior technique, re-erase is carried out each time a string has failed, and the fail check and re-erase are repeated. If erase verify per string is omitted and if only accumulated string erase verify is carried out, it is possible to complete erase operation at a high speed.

Also, for example, because of defects in manufacturing or degradation in a string, fail check and re-erase will become to be repeated many times when erase command is issued. Furthermore, when a certain block includes multiple strings that repeatedly fail checks, the above mentioned fail and re-erase set will be repeated for the block to be erased. In contrast, according to the second embodiment, before carrying out verify per string for the multiple strings that repeatedly fail checks, it is possible to find the blocks that include such strings. This leads to a shortening of erase busy time.

Figure 18:
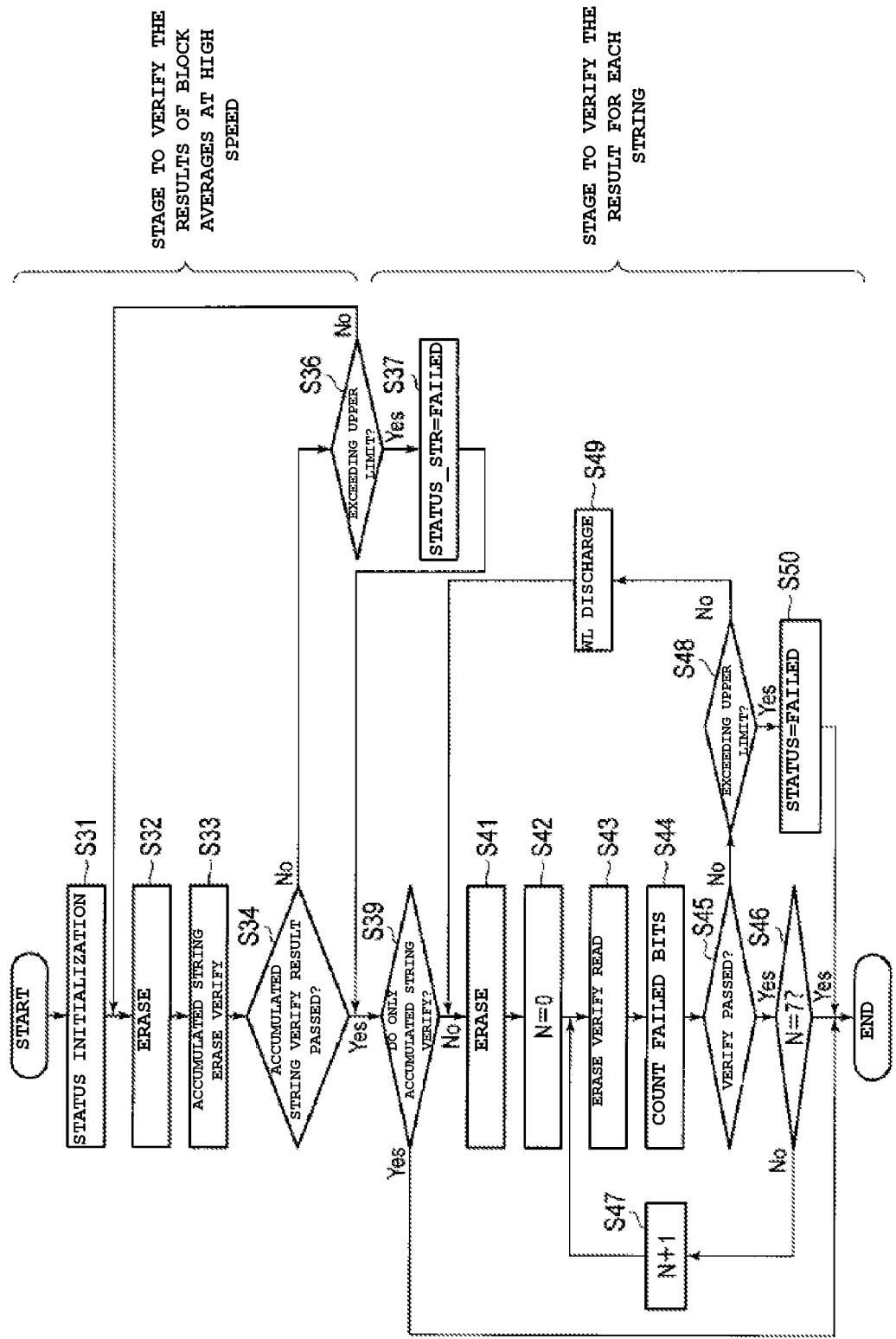
FIG. 18 is a flow chart of a first modified example of erase operation in the semiconductor memory device according to the second embodiment.

The flow of the second embodiment can also be as in FIG. 18 instead of FIG. 17. FIG. 18 is a flow chart of a first modification example of the erase operation of the semiconductor memory device pertaining to the second embodiment. As shown in FIG. 18, when the decision at step S36 is a Yes, the flow goes to step S39 via step S37. That is, when the string accumulated erase verify is a fail and the number of repetitions of erase exceeds the upper limit, it goes to erase verify per string. According to the first modification example, when the erase pulse application and erase verify are carried out multiple times, the possibility of erase verify fail in all strings is high at early time of erase verify. After the accumulated string erase verify has passed, if it goes to erase verify for each string, it is possible to shorten the overall time taken for erase verify.

Figure 19:
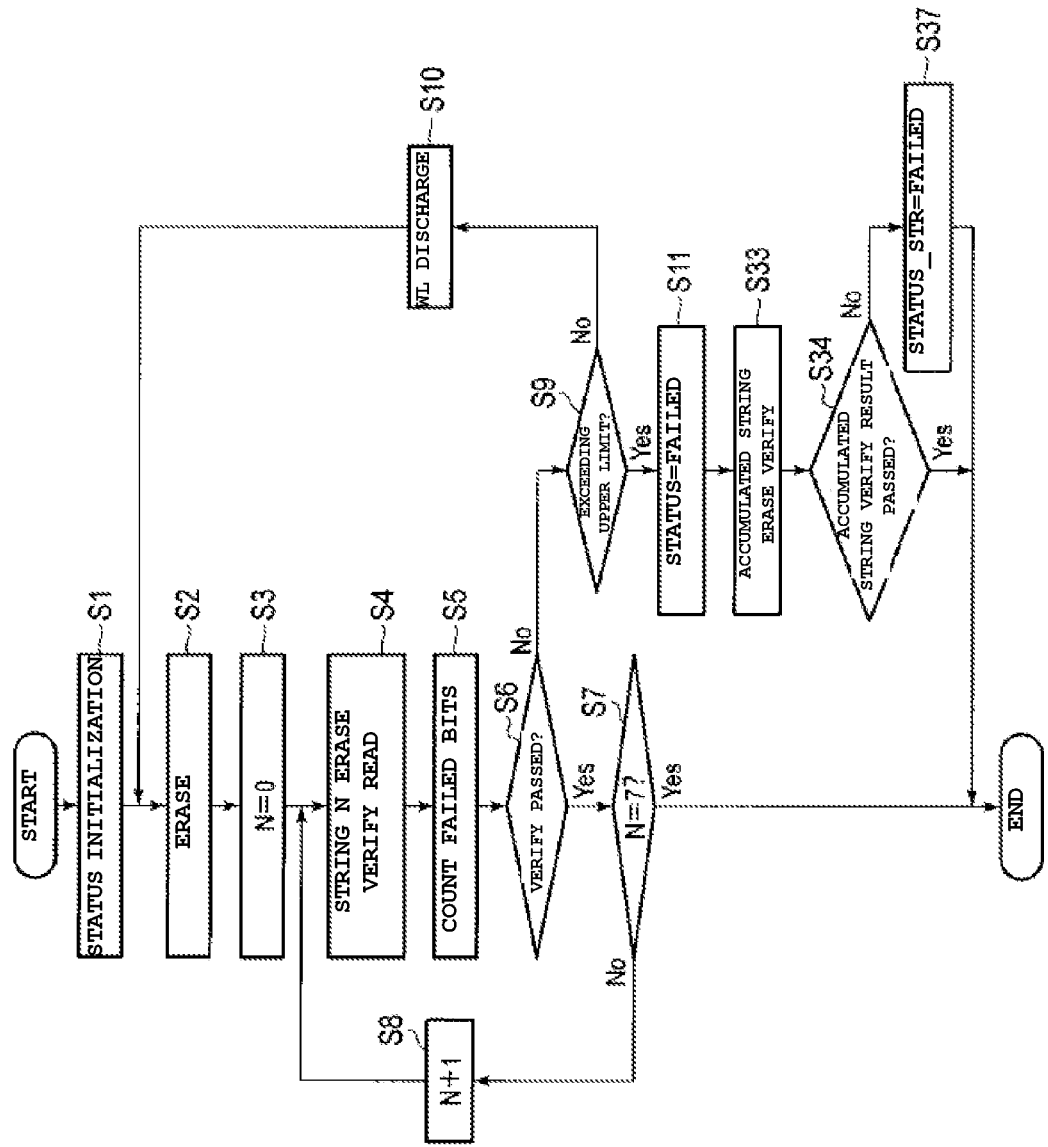
FIG. 19 is a flow chart of a second modified example of an erase operation in the semiconductor memory device according to the second embodiment.

It is also acceptable if the second embodiment is combined with the first embodiment and is as in FIG. 19. FIG. 19 is a flow chart of the second modification example of the erase operation of the semiconductor memory device pertaining to the second embodiment. From step S1 to step S11 are identical to FIG. 12. However, in step S1, as described with reference to step S1 of FIG. 12 in addition to the status register 5a, the status register 5b is also initialized.

In S6, when it is determined that the erase verify of a certain string StrN is a fail and the number of repetitions of the erase and erase verify has exceeded the threshold value (upper limit), the flow goes to step S11. In step S11, in order to indicate a fail of erase verify for string, the state machine (controller) 10 sets the data that indicates fail in the status register 5a. The point that the flow does not go to end step is different from the first embodiment.

In this example, it goes from erase verify for each string to the accumulated string erase verify.

More specifically, the flow goes from step S11 to step S33. In step S33, the state machine (controller) 10 carries out the accumulated string erase verify read. As a result of step S33, the result of erase verify read is stored in the caches UDL. Step S33 includes the operations from time t20 to time t41 of FIG. 14.

Next, in step S34, the state machine (controller) 10 checks the accumulated string erase verify result within the caches UDL. When the decision at step S34 is a Yes, the erase ends. On the other hand, when the decision at step S34 is a No, the flow goes to step S37. In step S37, the state machine (controller) 10 sets the data that indicates fail in the status register 5b.

In the second modification example, the following advantages can be obtained. When a block has multiple strings with, for example, defects in manufacturing or degradation, the erase verify of the given string does not pass, and the erase verify fail and re-erase for each string are repeated. Moreover, since the block that includes such a few defected strings is recognized as a failure block, the user can not use all strings in a block. In the second example, in erase verify for each string even if a certain string is always a fail, erase does not end, and the accumulated string erase verify is carried out. As a result, rather than the check of each string, fail bits information averaged across the block to be erased is collected, and it becomes possible to know the summarized erase results of the block at a high speed. This fact contributes to the improvement of the convenience of the semiconductor memory device 100.

Third Embodiment

The third embodiment is related to a semiconductor storage system that includes the semiconductor memory device of the second embodiment, and its controller.

Figure 20:
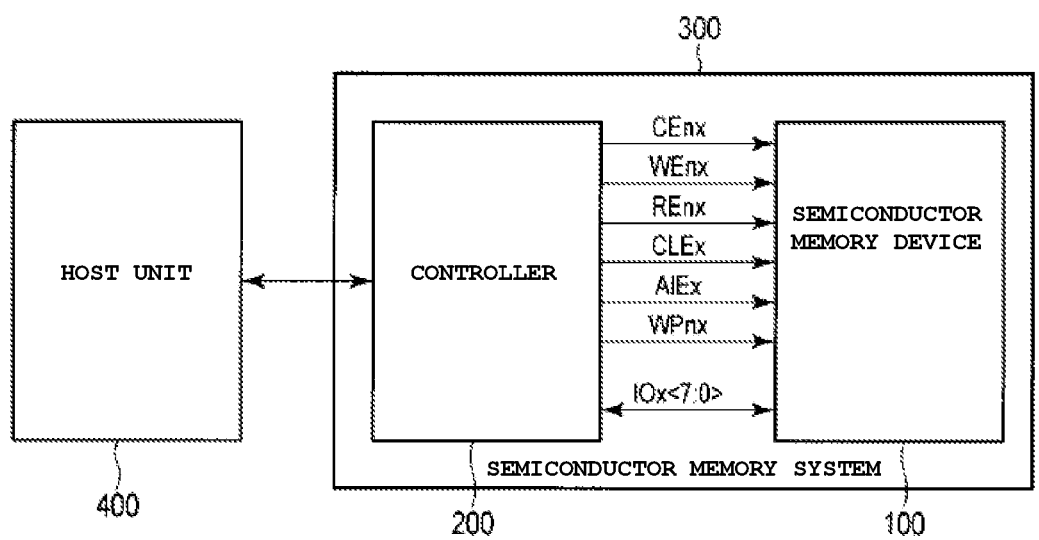
FIG. 20 is a drawing illustrating a semiconductor memory device system according to a third embodiment.

FIG. 20 shows a semiconductor storage system 300 pertaining to the third embodiment. As shown in FIG. 20, the semiconductor storage system 300 includes the semiconductor memory device 100 pertaining to the second embodiment, and the controller 200. The semiconductor memory device 100 communicates with the controller 200.

The controller 200 includes hardware and software related to operation of the semiconductor memory device 100. The controller 200 generates the chip enable signal CEnx, write enable signal WEnx, read enable signal REnx, command latch enable signal CLEx, address latch enable signal ALEx, write protect signal WPnx, and gives these to the semiconductor memory device 100. Also, the controller 200 generates signals such as address, command, data etc., and gives these to the semiconductor memory device 100 via the bidirectional bus IOx<7:0>. The semiconductor memory device 100 gives data to the controller 200 via the bidirectional bus IOx<7:0>. Depending on the need, a means by which the semiconductor memory device 100 notifies indications that the operations such as erase, etc. are complete, to the controller 200 may also be provided. The controller 200 communicates with the host device 400.

Upon receiving the signals CMD_STATUS and CMD_STATUS_STR, as displayed in FIG. 13 and as described by referring to FIG. 13, the command decoder 13 supplies these signals to the select circuit 18. Upon receiving the signal CMD_STATUS, the select circuit 18 supplies the signal STATUS from the status register 5a to the output buffer. On the other hand, upon receiving the signal CMD_STATUS_STR, the select circuit 18 supplies the signal STATUS_STR from the status register 5b to the output buffer 17. The output buffer 17 outputs the received signal STATUS or STATUS_STR from the semiconductor memory device 100, on to the bidirectional bus IO x<7:0>. This signal is received by the controller 200, and is received within the controller 200, for example, by a module that manages the entire controller. The module uses the received signal to determine the subsequent operations. The module is formed, for example, from software or hardware, or a combination of both.

In this embodiment, the decision as to whether or not a transition should happen to erase verify for each string after the accumulated string erase verify is entrusted to the determination of the controller 200. This point is in contrast with the second embodiment.

Figure 21:
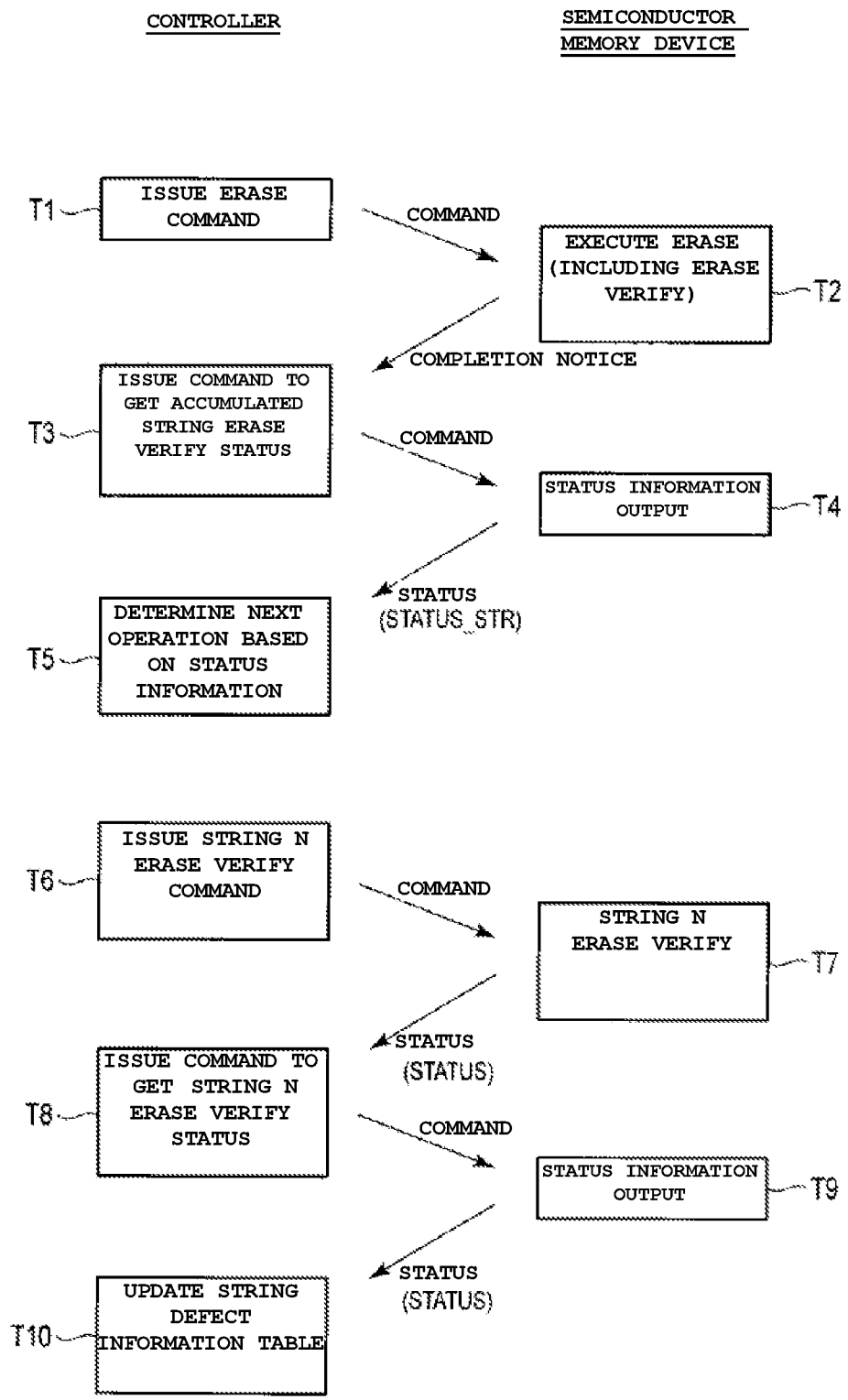
FIG. 21 is a drawing illustrating an erase operation in the semiconductor memory system according to the third embodiment.

With reference to FIG. 21, the operations of the semiconductor storage system of the third embodiment are described. FIG. 21 is a drawing that shows the tasks of the erase operation of the semiconductor storage system pertaining to the third embodiment. Time elapses from the top towards the bottom of the drawing. The processes and decisions of the controller 200 are mentioned on the left hand side of the figure, and the processes and operations of the semiconductor memory device 100 are mentioned on the right hand side of the figure. The arrows indicate the flow of commands or data.

As shown in FIG. 21, the controller 200 issues a command instructing the execution of the erase operation in the semiconductor memory device 100 (Task T1). The erase command includes instructions to execute the accumulated string erase verify, and additionally instructions of whether or not to carry out erase verify for each string simultaneously. For example, when shortening of the time taken for erase is required, the controller 200 gives a command that erase verify for each string is not to be carried out. When the result of erase verify for each string is also necessary along with that of the accumulated string erase verify, the controller 200 gives a command that erase verify for each string is also to be carried out. The semiconductor memory device 100 carries out erase and erase verify based on the contents of the command (task T2). Erase verify includes the accumulated string erase verify, and depending on the situation, erase verify for each string. The semiconductor memory device 100 notifies an indication erase complete if erase is completed, to the controller 200.

Next, the controller 200 issues a status read command to get the result of the accumulated string erase verify (Task T3). Upon receiving the command, the semiconductor memory device 100, activates the signal CMD_STATUS_STR, and outputs the status signal STATUS_STR from the status register 5b to the controller 200, through the bidirectional bus IOx<7:0> (Task T4). When the erase command also includes the execution of erase verify for each string, the semiconductor memory device 100, activates the signal CMD_STATUS, and outputs the status signal STATUS from the status register 5a to the controller 200, through the bidirectional bus IOx<7:0>.

Figures 22, 23:
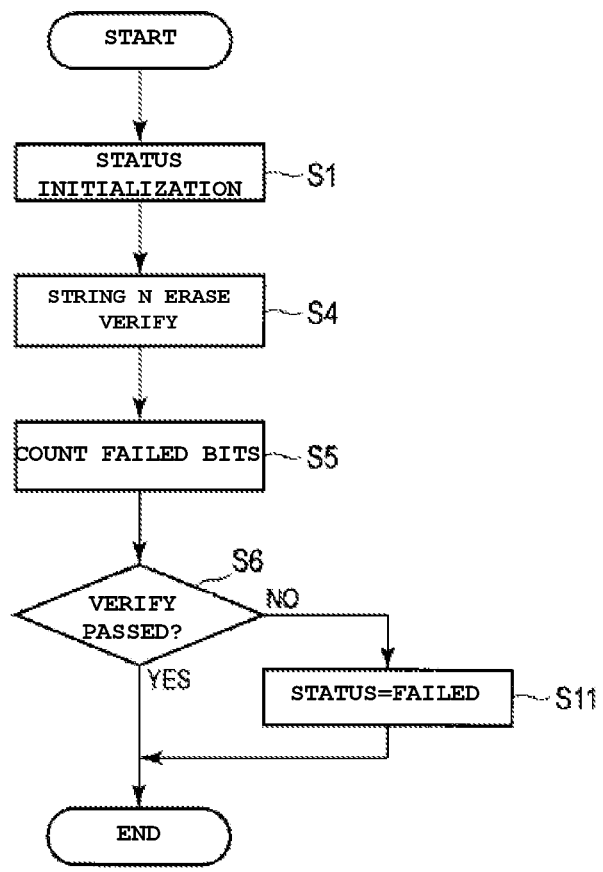
FIG. 22 is a drawing showing combinations of results from multiple verify operations according to the third embodiment.
FIG. 23 is a flow chart of the first string erase verify operation according to the third embodiment.

Upon receiving the status signal, the controller 200 decides the operations that must be performed next on the basis of this signal (task T5). An example of the combination of the information received by the controller 200 and the results of verify are shown in FIG. 22. When the accumulated string erase verify and erase verify for each string are carried out, and when the status STATUS and the status STATUS_STR are both pass, it implies that the block erase has passed. Hence, in general, the controller 200 does not need to acquire additional information, and carry out additional operations related to the erase operation. Therefore, the controller 200 can transition to arbitrary operations such as execution of other tasks from the host device 400, etc.

On the other hand, when the status STATUS is a fail and the status STATUS_STR is a pass, this indicates that there are strings that has fails equal or more than the permissible number in a specific string of a block to be erased. In this case, if there is room in the storage capacity of the semiconductor memory device 100, the controller 200 can determine the fact that the block to be erased is a block erase fail. Alternately, it is possible for the controller 200 to select methods such as acquiring additional information, for example, to search for usable areas excluding the specific string, etc.

Also, when the status STATUS_STR is a fail, in most cases, it is determined that it is a block erase fail. In such a case and when the erase command does not include instructions to also carry out the erase verify for each string, it is possible for the controller 200 to select a method in which information is acquired additionally, to search for usable areas (strings) within the block that has been determined as failed. For this additional search, the controller 200 issues a command to execute erase verify for a specific string StrN, to the semiconductor memory device 100 (task T6). If the semiconductor memory device 100 receives the command, it carries out erase verify for 1 string StrN (task T7). This erase verify has the flow shown in FIG. 23. The flow of FIG. 23 corresponds to some portions of the flow of FIG. 12, and differs from the flow of FIG. 12 in the point that erase verify is carried out only for string StrN. Specifically, the steps S1, S4, S5, and S6 are carried out, and if the decision at step S6 is a Yes, the flow ends, and if it is a No, step S11 is carried out. Subsequently, the semiconductor memory device 100 stores the results of verify to the register 5a, and at the same time, notifies the completion of erase verify for the string StrN to the controller 200.

Return to FIG. 21. Upon receiving the notification, the controller 200 issues a command to acquire the status information of erase verify for the string N, to the semiconductor memory device 100 (task T8). Upon receiving the command, the semiconductor memory device 100 activates the signal CMD_STATUS, and outputs the status signal STATUS from the status register 5a to the controller 200, through the bidirectional bus IOx <7:0> (task T9).

In accordance with the status information received, the controller 200 updates the string failure information table being maintained within the controller. Specifically, if the erase verify for the string StrN is a pass, the controller 200 recognizes that a block is failed but some of strings in the block are passed. Then, it maintains this kind of information in the string failure information table. The string failure information table, for example, is maintained in the volatile or nonvolatile memory within the controller 200. The controller 200 treats the usable areas (strings) as areas (strings) without special classification, or treats them as strings in which may find failure. It depends on the design of semiconductor storage system 300 how treat them. On the other hand, if the erase verify for the string StrN is a fail, the controller 200 decides that a block that includes string StrN has failed. Then the contoller 200 does not access it.

As explained above, the semiconductor memory device 100 carries out an accumulated string erase verify, erase verify for each string, and one string erase verify corresponding to the commands received from external, and outputs status signals STATUS and STATUS_STR, according to the third embodiment. These series of the operations relating to the acquirement of various verify and status information are not the automatic operation of the semiconductor memory device 100, but are conducted under the control by and command from the controller 200. Therefore, the possibility of carrying out a fine control and understanding a fine status can be offered, and it is possible to use erase failure blocks that conventionally must be made to an erase fail, and the way to use storage area effectively is provided. What is more, this can be run at a short period of time. The semiconductor memory device 100 should just prepare various erase verify, the selection of various erase verify is in the controller. For this reason, the semiconductor memory device 100 can provide flexibility in terms of usage patterns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Structure of the memory cell array 1 is not limited as above description. A memory cell array formation may be disclosed in U.S. patent application Ser. No. 12/532,030, filed on Mar. 23, 2009, the entire contents of which are incorporated by reference herein.

Furthermore, a memory cell array formation may be disclosed in U.S. patent application Ser. No. 12/679,991, filed on Mar. 25, 2010, and in U.S. patent application Ser. No. 13/236,734, filed Sep. 20, 2011, the entire contents of which are incorporated by reference herein.

(Additional Statement)

Note 1. A semiconductor memory device, comprising:

a memory block including a plurality of memory strings each string including a plurality of memory cell transistors connected in series with a first selection transistor on a first end and a second selection transistor on a second end, the plurality of memory strings including a first memory string and a second memory string;

a first bit line connected to the first selection transistor of the first memory string and the first selection transistor of the second memory string;

a sense amplifier connected to the first bit line;
a plurality of word lines, each word line connected to a memory cell transistor in each memory string; and
a controller configured to control an erase operation of the memory block, wherein the erase operation includes:
  applying a first erase voltage to the plurality of word lines;
  addressing the first memory string by applying a selection voltage to a gate electrode of the first and second selection transistor of the first memory string;
  applying an erase verify voltage to the plurality of word lines and reading data of memory cell transistors in the first memory string using the sense amplifier; and
  addressing the second memory string without first discharging the plurality of word lines.

Note 2. The semiconductor memory device of note 1, wherein the erase operation including a step for applying an erase voltage and an erase verify and a controller is configured to make an enable signal for the sense amplifier twice during the erase verify for both a first memory string and a second memory string.

Note 3. The semiconductor memory device of note 1, wherein the controller is configured to carry out an erase verify for each memory string and to store results of the erase verify for each memory string in a first cache.

Note 4. The semiconductor memory device of note 2, wherein the controller is configured to carry out the erase verify for each memory string and to store results of erase verify for each memory string in a first cache.

Note 5. The semiconductor memory device of note 1, wherein the controller is configured to carry out an accumulated string erase verify for all memory strings, and the controller is configured to determine whether a memory string passed or failed the erase verify based on a result of the accumulated string erase verify.

Note 6. The semiconductor memory device of note 1, wherein the sense amplifier includes a logic circuit configured to determine whether a memory string passed or failed an erase verify based on a result of the erase verify corresponding to a first memory string and a result of the erase verify corresponding to a second memory string, the first memory string being different from the second memory string.

Note 7. The semiconductor memory device of note 3, wherein the sense amplifier includes a logic circuit configured to determine whether a memory string passed or failed the erase verify based on a result of the erase verify corresponding to a first memory string and a result of the erase verify corresponding to a second memory string, the first memory string being different from the second memory string.

Note 8. The semiconductor memory device of note 4, wherein the sense amplifier includes a logic circuit configured to determine whether a memory string passed or failed the erase verify based on a result of the erase verify corresponding to a first memory string and a result of the erase verify corresponding to a second memory string, the first memory string being different from the second memory string.

Note 9. The semiconductor memory device of note 6, wherein the sense amplifier includes a second cache for storing the output of the logic circuit.

Note 10. The semiconductor memory device of note 8, wherein the sense amplifier includes a second cache for storing the output of the logic circuit.

Note 11. The semiconductor memory device of note 1, further comprising a verify circuit, the verify circuit including a first register and a second register, the first register being capable of holding a first data indicated whether an erase verify for each string has passed, the second register being capable of holding a second data indicated whether an accumulated string erase verify has passed.

Note 12. The semiconductor memory device of note 10, further comprising a verify circuit, the verify circuit including a first register and a second register, the first register being capable of holding a first data indicated whether the erase verify for each string has passed, the second register being capable of holding a second data indicated whether an accumulated string erase verify has passed.

Note 13. The semiconductor memory device of note 11, further comprising a output buffer, the output buffer outputting the first data or the second data based on an instruction from outside.

Note 14. The semiconductor memory device of note 12, further comprising a output buffer, the output buffer outputting the first data or the second data based on an instruction from outside.

Note 15. The semiconductor memory device of note 14, wherein the controller is configured to carry out the erase verify for each memory string based on a first signal and to carry out the accumulated string erase verify for all memory string based on a second signal, the first signal being different from the second signal.

Note 16. A memory system, comprising:
a memory block including a plurality of memory strings each string including a plurality of memory cell transistors connected in series with a first selection transistor on a first end and a second selection transistor on a second end, the plurality of memory strings including a first memory string and a second memory string;
a first bit line connected to the first selection transistor of the first memory string and the first selection transistor of the second memory string;
a sense amplifier connected to the first bit line;
a plurality of word lines, each word line connected to a memory cell transistor in each memory string;
a controller configured to control an erase operation of the memory block, wherein the erase operation includes:
  applying a first erase voltage to the plurality of word lines;
  addressing the first memory string by applying a selection voltage to a gate electrode of the first and second selection transistor of the first memory string;
  applying an erase verify voltage to the plurality of word lines and reading data of memory cell transistors in the first memory string using the sense amplifier; and
  addressing the second memory string without first discharging the plurality of word lines;
wherein the controller is configured to carry out an accumulated string erase verify for all memory strings, and the controller is configured to determine whether a memory string passed or failed the erase verify based on a result of the accumulated string erase verify.

Note 17. The memory system of note 16, wherein the erase operation including a step for applying an erase voltage and an erase verify and a controller is configured to make an enable signal for the sense amplifier twice during the erase verify.

Note 18. A method of controlling a memory device including a memory block with a plurality of memory strings each string including a plurality of memory cell transistors connected in series with a first selection transistor on a first end and a second selection transistor on a second end, the plurality of memory strings including a first memory string and a second memory string, a first bit line connected to the first selection transistor of the first memory string and the first selection transistor of the second memory string, a sense amplifier connected to the first bit line, a plurality of word lines, each word line connected to a memory cell transistor in each memory string, and a controller, the method comprising:

applying a first erase voltage to the plurality of word lines;

addressing the first memory string by applying a selection voltage to a gate electrode of the first and second selection transistor of the first memory string;

applying an erase verify voltage to the plurality of word lines and reading data of memory cell transistors in the first memory string using the sense amplifier; and addressing the second memory string in the memory block without first discharging the plurality of word lines.

What is claimed is:

1. A semiconductor memory device comprising:
   a first bit line;
   a first source line;
   a first memory block including a first memory string and
      a second memory string,
      the first memory string including
         a first selection transistor having one end coupled to the first bit line,
         a first memory cell transistor having one end coupled to the other end of the first selection transistor, and
         a second selection transistor having one end coupled to the other end of the first memory cell transistor,
      the second memory string including
         a third selection transistor having one end coupled to the first bit line,
         a second memory cell transistor having one end coupled to the other end of the third selection transistor, and
         a fourth selection transistor having one end coupled to the other end of the second memory cell transistor,
   a first select gate line coupled to a gate of the first selection transistor;
   a second select gate line coupled to a gate of the third selection transistor;
   a first word line coupled to a gate of the first memory cell transistor and a gate of the second memory cell transistor; and
   a state machine configured to, upon receipt of an erase command including an address of the first memory block from outside the semiconductor memory device, perform an erase operation on the first memory cell transistor and the second memory cell transistor, the erase operation including an erase voltage apply operation and an erase verify operation,
   wherein, in the erase verify operation,
      during a first time period,
         a first voltage is applied to the first word line,
         a second voltage is applied to the first select gate line, and
         a third voltage is applied to the second select gate line,
      during a second time period after the time period,
         a fourth voltage different from the first voltage is applied to the first word line,
         a fifth voltage is applied to the first select gate line to turn on the first selection transistor, and
         a sixth voltage is applied to the second select gate line to turn off the third selection transistor,
      during a third time period after the second time period,
         the fourth voltage is applied to the first word line,
         a seventh voltage is applied to the first select gate line to turn off the first selection transistor, and
         an eighth voltage is applied to the second select gate line to turn off the third selection transistor,
      during a fourth time period after the third time period,
         the fourth voltage is applied to the first word line,
         a ninth voltage is applied to the first select gate line to turn off the first selection transistor, and
         a tenth voltage is applied to the second select gate line to turn on the third selection transistor, and
      during a fifth time period after the fourth time period,
         the fourth voltage is applied to the first word line,
         an eleventh voltage is applied to the first select gate line to turn off the first selection transistor, and
         a twelfth voltage is applied to the second select gate line to turn off the third selection transistor.

2. The semiconductor memory device of claim 1, further comprising:
   a third select gate line coupled to a gate of the second selection transistor;
   a fourth select gate line coupled to a gate of the fourth selection transistor;
   wherein, in the erase verify operation,
      during the first time period,
         the second voltage is applied to the third select gate line, and
         the third voltage is applied to the fourth select gate line,
      during the second time period,
         the fifth voltage is applied to the third select gate line, and
         the sixth voltage is applied to the fourth select gate line,
      during the third time period,
         the seventh voltage is applied to the third select gate line, and
         the eighth voltage is applied to the fourth select gate line,
      during the fourth time period,
         the ninth voltage is applied to the third select gate line, and
         the tenth voltage is applied to the fourth select gate line, and
      during the fifth time period,
         the eleventh voltage is applied to the third select gate line, and
         the twelfth voltage is applied to the fourth select gate line.

3. The semiconductor memory device of claim 1, wherein the first voltage, the second voltage, and the third voltage are the same, and
   the fifth voltage is higher than the sixth voltage, and the ninth voltage is lower than the tenth voltage.

4. The semiconductor memory device of claim 1, wherein the fourth voltage is higher than the first voltage.

5. The semiconductor memory device of claim 1, wherein the first memory cell transistor is one of a plurality of first memory cell transistors between the first and second selection transistors,
   the second memory cell transistor is one of a plurality of second memory cell transistors between the third and fourth selection transistors,
   the first word line is one of a plurality of first word lines, each of which is coupled to a respective one of the gates of the first memory cell transistors and to a respective one of the gates of the second memory cell transistors, each of the first word lines extend in a first direction and in a second direction, and the first word lines are stacked in a third direction, the first, second, and third directions being perpendicular to one another, and during the second, third, fourth, and fifth time periods, the fourth voltage is applied to each of the first word lines.

6. The semiconductor memory device of claim 1, further comprising:

a sense amplifier coupled to the first bit line, wherein the state machine is configured to apply an enable signal to the sense amplifier at a first timing during the second time period and at a second timing during the fourth time period, the enable signal causing the sense amplifier to sense an electrical state of the first bit line.

7. The semiconductor memory device of claim 6, wherein the sense amplifier includes a logic circuit configured to determine whether the first memory string passed or failed based on the electrical state sensed as a result of the enable signal at the first timing and whether the second memory string passed or failed based on the electrical state sensed as a result of the enable signal at the second timing.

8. The semiconductor memory device of claim 6, wherein the state machine includes a first cache configured to store data corresponding to the electrical state sensed as a result of the enable signal at the first timing and data corresponding to the electrical state sensed as a result of the enable signal at the second timing, and the sense amplifier includes a second cache configured to store a determination result of the logic circuit.

9. The semiconductor memory device of claim 6, wherein the state machine is further configured to store data corresponding to the electrical state sensed as a result of the enable signal at the first timing and data corresponding to the electrical state sensed as a result of the enable signal at the second timing in a cumulative manner.

10. The semiconductor memory device of claim 9, wherein the state machine is further configured to suspend the erase verify operation when a cumulative number of failures is greater than or equal to a given number.

11. The semiconductor memory device of claim 1, wherein the erase verify operation includes multiple loops of a sequence of sub verify operations performed for a corresponding one of the first memory string and the second memory string.

12. The semiconductor memory device of claim 1, wherein the fourth voltage is higher than a voltage applied to the first word line and the second word line during the erase voltage apply operation.

* * * * *